(12) United States Patent
Kaneko et al.

(10) Patent No.: US 9,373,483 B2
(45) Date of Patent: Jun. 21, 2016

(54) PLASMA PROCESSING APPARATUS AND HIGH FREQUENCY GENERATOR

(71) Applicant: TOKYO ELECTRON LIMITED, Tokyo (JP)

(72) Inventors: Kazushi Kaneko, Miyagi (JP); Kazunori Funazaki, Miyagi (JP); Hideo Kato, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 14/420,102

(22) PCT Filed: May 29, 2013

(86) PCT No.: PCT/JP2013/064876
§ 371 (c)(1),
(2) Date: Feb. 6, 2015

(87) PCT Pub. No.: WO2014/024546
PCT Pub. Date: Feb. 13, 2014

(65) Prior Publication Data
US 2015/0214011 A1     Jul. 30, 2015

(30) Foreign Application Priority Data
Aug. 9, 2012   (JP) .................................. 2012-176668

(51) Int. Cl.
*H01J 37/32*     (2006.01)
*H05H 1/46*      (2006.01)

(52) U.S. Cl.
CPC ....... *H01J 37/32128* (2013.01); *H01J 37/3211* (2013.01); *H01J 37/32119* (2013.01);
(Continued)

(58) Field of Classification Search
CPC ..................... H01J 37/32192; H01J 37/32128; H01J 37/3211; H01J 2237/327
USPC .................................................. 315/111.21
See application file for complete search history.

(56) References Cited

U.S. PATENT DOCUMENTS 6,211,749 B1 *   4/2001   Yuzurihara .............. H03H 7/38
                                                     333/17.3
(Continued)

FOREIGN PATENT DOCUMENTS

JP         5-144381 A     6/1993
JP         5-299024 A    11/1993
(Continued)

OTHER PUBLICATIONS

International Search Report mailed Aug. 27, 2013 in PCT/JP2013/064876.

*Primary Examiner* — Douglas W Owens
*Assistant Examiner* — Pedro C Fernandez
(74) *Attorney, Agent, or Firm* — Rothwell, Figg, Ernst & Manbeck, P.C.

(57) ABSTRACT

Provided is a plasma processing apparatus that performs a processing on a processing target object using plasma. The plasma processing apparatus includes a processing container and a plasma generating mechanism including a high frequency generator disposed outside of the processing container to generate high frequency waves. The plasma generating mechanism generates plasma in the processing container using the high frequency waves and includes: a high frequency oscillator that oscillates the high frequency waves; a power supply unit that supplies a power to the high frequency oscillator; a waveguide path that propagates the high frequency waves oscillated by the high frequency oscillator to the processing container side which becomes a load side; and a voltage standing wave ratio variable mechanism that varies a voltage standing wave ratio of voltage standing waves formed in the waveguide path by the high frequency waves, according to the power supplied from the power supply unit.

9 Claims, 18 Drawing Sheets

(52) U.S. Cl.
CPC ..... *H01J37/32192* (2013.01); *H01J 37/32229* (2013.01); *H01J 37/32256* (2013.01); *H05H 1/46* (2013.01); *H01J 2237/327* (2013.01); *H01J 2237/334* (2013.01); *H01J 2237/3321* (2013.01); *H05H 2001/4622* (2013.01)

(56) References Cited

U.S. PATENT DOCUMENTS

| | | | | |
|---|---|---|---|---|
| 7,863,997 | B1* | 1/2011 | Alton | H01P 5/183 333/113 |
| 2006/0016395 | A1* | 1/2006 | Nishimura | H01J 37/32192 118/715 |
| 2008/0231380 | A1* | 9/2008 | Shinohara | H01J 23/34 331/86 |
| 2011/0266257 | A1* | 11/2011 | Nishizuka | H01J 37/32192 216/69 |
| 2012/0160809 | A1* | 6/2012 | Ishibashi | C23C 16/511 216/69 |

FOREIGN PATENT DOCUMENTS

| | | |
|---|---|---|
| JP | 2006-94214 A | 4/2006 |
| JP | 2007-82172 A | 3/2007 |
| JP | 2007-157518 A | 6/2007 |
| JP | 2010-283678 A | 12/2010 |

* cited by examiner

ABSTRACT# PLASMA PROCESSING APPARATUS AND HIGH FREQUENCY GENERATOR

CROSS REFERENCE TO RELATED APPLICATION

This application is a 35 U.S.C. 371 National Phase Entry Application from PCT/JP2013/064876, filed May 29, 2013, which claims priority to Japanese Patent Application No. 2012-176668, filed Aug. 9, 2012, the disclosures of which are incorporated herein in their entirety by reference.

TECHNICAL FIELD

The present invention relates to a plasma processing apparatus and a high frequency generator. In particular, the present invention relates to a high frequency generator that generates microwaves, and a plasma processing apparatus that generates plasma using the microwaves.

BACKGROUND

Semiconductor elements such as, for example, a large scale integrated circuit (LSI), a metal oxide semiconductor (MOS) transistor, a liquid crystal display (LCD), and an electro luminescence (EL) element, are manufactured by performing a processing such as, for example, etching, chemical vapor deposition (CVD), or sputtering, on a processing target substrate which is an object to be processed. The processings such as, for example, etching, CVD and sputtering, include processing methods using plasma as an energy supply source, i.e., plasma etching, plasma CVD, and plasma sputtering.

In a plasma processing apparatus performing a processing using plasma generated by microwaves, a magnetron may be used as a high frequency generating source when generating microwaves. The magnetron is effectively used as a microwave generating source since it may be configured relatively inexpensively. Further, the magnetron may output a high power. Japanese Patent Laid-Open Publication No. 2006-94214 (Patent Document 1), Japanese Patent Laid-Open Publication No. 2007-82172 (Patent Document 2), and Japanese Patent Laid-Open Publication No. 2010-283678 (Patent Document 3) disclose technics related to the magnetron.

According to Patent Document 1, a magnetron oscillation device is provided with a reference signal supply unit and an impedance generator so as to adjust a load impedance of a magnetron. In addition, according to Patent Document 2, a magnetron oscillation device is configured to be provided with an irreversible member. Further, according to Patent Document 3, a shift from a desired oscillation frequency is detected so as to generate a shift signal in a magnetron oscillation device, and a driving voltage having a frequency desired by the oscillation frequency of a magnetron is generated based on the shift signal and output to an impedance generator.

PRIOR ART DOCUMENT

Patent Document

Patent Document 1: Japanese Patent Laid-Open Publication No. 2006-94214
Patent Document 2: Japanese Patent Laid-Open Publication No. 2007-82172
Patent Document 3: Japanese Patent Laid-Open Publication No. 2010-283678

SUMMARY OF THE INVENTION

Problems to be Solved

A magnetron serving as a microwave generating source is constituted with machined products such as, for example, a filament, an anode vane constituting an anode side, and a cavity resonance unit. When a plurality of magnetrons are manufactured by assembling these machined products, variation so-called a machine difference occurs among the plurality of magnetrons. Of course, it is preferable that the machine difference among the plurality of magnetrons and the influence of the machine difference on the characteristics are as small as possible.

When a value of power set for generating microwaves is in a high range, fundamental frequency waveforms, i.e. positions of peaks in formed spectrum shapes and narrowness of so-called skirt regions of the peaks, are slightly different from each other among the magnetrons, but they are not greatly different from each other. That is, in the fundamental frequency waveform of each magnetron, an ideal waveform having a steep peak and a narrow skirt region is obtained to be included in a tolerable machine difference range in each magnetron. However, when the value of power set for generating microwaves is lowered, the variation degrees of fundamental frequency waveforms tend to increase among the magnetrons. That is, the positions of the peaks and spreading directions of the skirt regions of the peaks may become greatly different from each other in the fundamental frequency waveforms among the magnetrons. It is believed that this is caused since the emission of electrons from a cathode electrode is reduced. When the value of power set for generating microwaves is reduced, the machine difference is likely to appear remarkably among the magnetrons and an ideal waveform may not be obtained.

Under this circumstance, reduction of power supplied to a magnetron may affect a frequency characteristic at an antenna side that becomes a load side in a plasma processing apparatus. Then, generated plasma is varied and as a result, an effective power input to the antenna may be varied. Consequently, stable and uniform plasma may not be generated which may affect a plasma processing performed on a processing target substrate.

Further, in a magnetron manufactured by assembling machined products, the magnetron state is varied as compared to a so-called initial state just after the magnetron is assembled, as the magnetron is used. For example, consumption of a surface carbon layer of a thorium tungsten alloy, which is a material of the filament, may cause variation in an oscillation state. In the case where the magnetron state is varied, the fundamental frequency waveform is more remarkably affected when the magnetron is used in a low set power range, which may affect the plasma processing.

As described above, when the power supplied to the magnetron is low, the plasma processing may consequently be affected. Thus, it is also considered to establish process conditions to avoid the use of the magnetron at such a low set power. However, in view of flexibility of process conditions in recent plasma processings, it is requested that the set power be used in a broader range. In addition, the technics disclosed in Patent Documents 1 to 3 cannot cope with this situation.

Means to Solve the Problems

In one aspect of the present invention, a plasma processing apparatus performs a processing on a processing target object using plasma. The plasma processing apparatus includes: a processing container configured to perform a processing by plasma therein; and a plasma generating mechanism including a high frequency generator disposed outside of the processing container to generate high frequency waves, in which the plasma generating mechanism is configured to generate plasma in the processing container using the high frequency waves generated by the high frequency generator. The high frequency generator includes: a high frequency oscillator configured to oscillate the high frequency waves; a power supply unit configured to supply a power to the high frequency oscillator; a waveguide path configured to propagate the high frequency waves oscillated by the high frequency oscillator to the processing container side which becomes a load side; and a voltage standing wave ratio variable mechanism configured to vary a voltage standing wave ratio (which may be simply referred to as "VSWR" below) of voltage standing waves formed in the waveguide path by the high frequency waves, according to the power supplied from the power supply unit.

With the configuration as described above, the voltage standing wave ratio of the voltage standing waves formed in the waveguide path may be varied according to the power supplied from the power supply unit by the voltage standing wave ratio variable mechanism included in the high frequency generator. Then, for example, when the power supplied from the power supply unit is a low power, the voltage standing wave ratio may be varied to be relatively high so that, in a fundamental frequency waveform, a skirt shape of a peak may be narrowed to make the peak steep. That is, even with the low power, an ideal fundamental frequency waveform may be formed. In such a case, when the fundamental frequency waveform has a steep peak and a narrow skirt region of the peak, formation of stable standing waves or formation an electromagnetic field based on the formation of stable standing waves may be performed, for example, in the subsequent matching process with plasma load, even if the position of the peak is slightly different. Then, stable and uniform plasma may consequently be generated in the processing container, and the influence of a machine difference on the process may be suppressed. Accordingly, when the plasma processing is performed, stable plasma may be generated even if the high frequency generator is set to a low power. As a result, the plasma may be generated more stably over a broad region from the low power to the high power, and a wide process condition may be constituted. That is, in the high frequency generator provided in the plasma processing apparatus, a process establishment is enabled not only at a high power but also at a low power. Meanwhile, the voltage standing wave ratio is obtained by dividing the maximum value of the voltage standing waves by the minimum value. When no reflected wave exists, the VSWR is 1.

The voltage standing wave ratio variable mechanism may be configured to include a stub mechanism provided in the waveguide path and including a rod-shaped member movable in a radial direction, a driver configured to move the rod-shaped member, and a control mechanism configured to control the movement of the rod-shaped member.

A plurality of rod-shaped members may be provided be spaced apart from each other in a direction where the high frequency waves travel.

The voltage standing wave ratio variable mechanism may be configured to perform a control to increase the voltage standing wave ratio when the power supplied from the power supply unit to the high frequency oscillator is lower than a predetermined value.

The high frequency generator may be configured to include a directional coupler installed in the waveguide path, in which the directional coupler may be configured to branch some of travelling waves that travel in the waveguide and reflected waves from the load side, and the control mechanism may be configured to control the movement of the stub member based on a travelling wave power signal and a reflected wave power signal which are obtained from the directional coupler.

The plasma generating mechanism may be configured to include a 4E tuner provided with four movable short-circuit plates. The four movable short-circuit plates are provided to be spaced apart from each other in the travelling direction of the high frequency waves.

The waveguide path may be configured to include a launcher from which the high frequency waves oscillated by the high frequency oscillator are taken out, and an isolator provided at a downstream side of the launcher, in which the isolator is configured to transmit a frequency signal in one direction from the high frequency oscillator to the load side, and the stub mechanism may be provided on the launcher or at the downstream side of the launcher and at an upstream side of the isolator.

The plasma generating mechanism may be configured to include a dielectric window configured to transmit the high frequency waves generated by the high frequency oscillator into the processing container, and a slot antenna plate having a plurality of slot holes formed therein to radiate the high frequency waves to the dielectric window.

The plasma generated by the plasma generating mechanism may be produced by the radial line slot antenna.

In another aspect of the present invention, a high frequency generator includes: a high frequency oscillator configured to oscillate high frequency waves; a power supply unit configured to supply power to the high frequency oscillator; a waveguide path configured to propagate the high frequency waves oscillated by the high frequency oscillator to the processing container which becomes a load side; and a voltage standing wave ratio variable mechanism configured to vary a voltage standing wave ratio of voltage standing waves formed in the waveguide path by the high frequency waves, according to the power supplied from the power supply unit.

Effect of the Invention

According to the plasma processing apparatus and the high frequency generator described above, the voltage standing wave ratio of the voltage standing waves formed in the waveguide path may be varied according to the power supplied from the power supply unit by the voltage standing wave ratio variable mechanism included in the high frequency generator. Then, for example, when the power supplied from the power supply unit is a low power, the voltage standing wave ratio may be varied to be relatively high so that, in a fundamental frequency waveform, a skirt shape of a peak may be narrowed to make the peak steep. That is, even with the low power, an ideal fundamental frequency waveform may be formed. In such a case, when the fundamental frequency waveform has a steep peak and a narrow skirt region of the peak, formation of stable standing waves or formation of an electromagnetic field based on the formation of stable standing waves may be performed, for example, in the subsequent matching process with plasma load, even if the position of the peak is slightly different. Then, stable and uniform plasma may be generated in the processing container consequently, and the influence of a machine difference on the process may be suppressed. Accordingly, when the plasma processing is performed, stable plasma may be generated even if the high frequency generator is set to a low power. As a result, the plasma may be generated more stably over a broad region from the low power to the high power, and a wide process condition may be constituted.

DETAILED DESCRIPTION TO EXECUTE THE INVENTION

Figure 1:
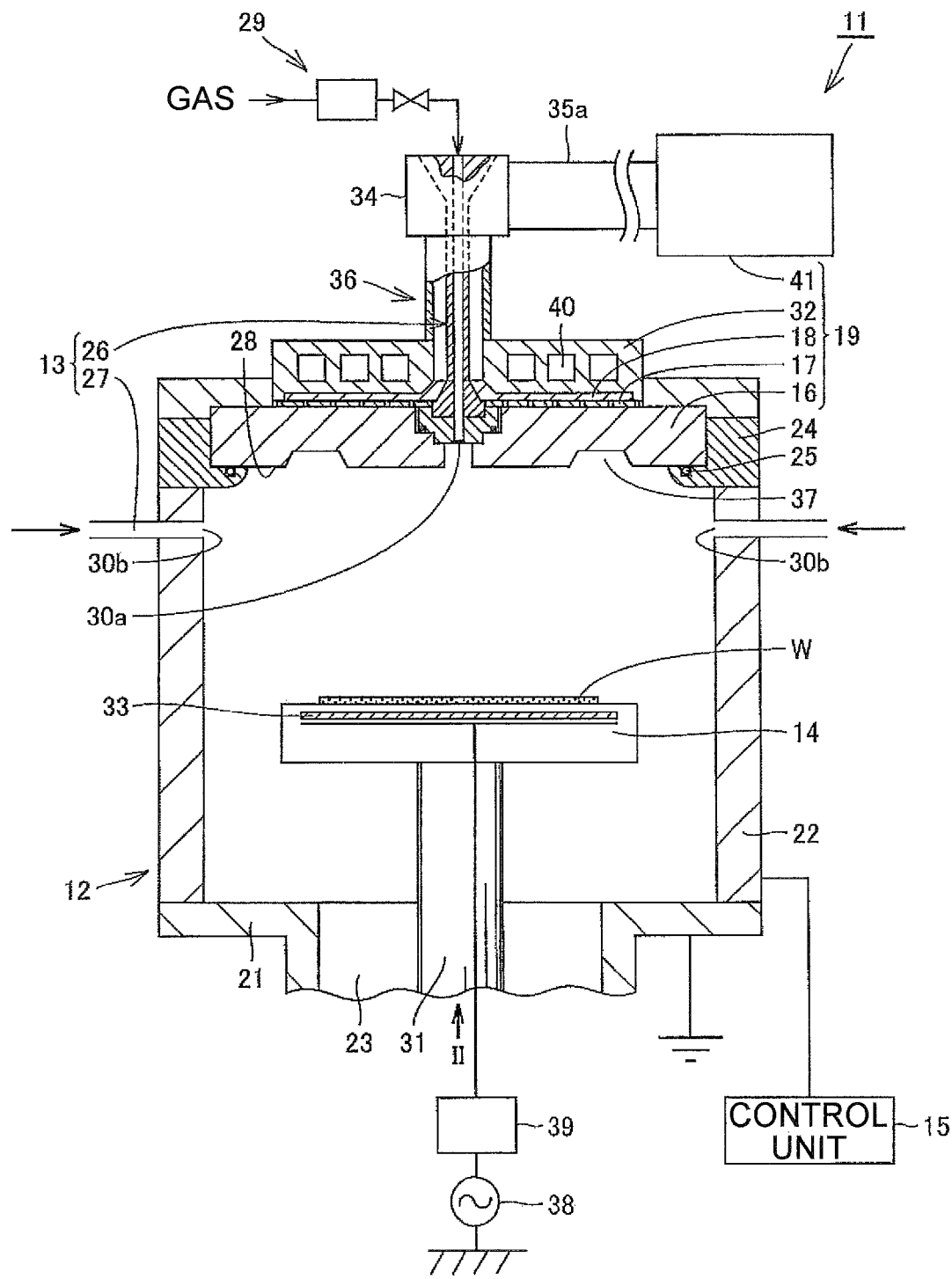
FIG. 1 is a schematic cross-sectional view illustrating main parts of a plasma processing apparatus according to an exemplary embodiment of the present invention.
Figure 2:
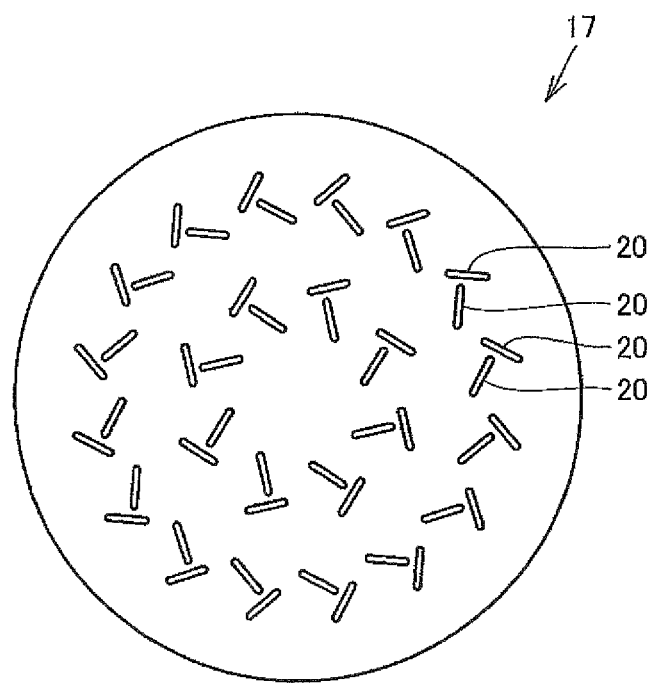
FIG. 2 is a view illustrating a slot antenna plate included in the plasma processing apparatus, in which the slot antenna plate is viewed from the bottom side, i.e. in the direction indicated by arrow II in FIG. 1.

Hereinafter, exemplary embodiments of the present invention will be described with reference to the accompanying drawings. FIG. 1 is a schematic cross-sectional view illustrating main parts of a plasma processing apparatus according to an exemplary embodiment of the present invention. FIG. 2 is a view illustrating a slot antenna plate included in the plasma processing apparatus illustrated, in which the slot antenna plate is viewed from the bottom side, i.e. in the direction indicated by arrow II in FIG. 1. In FIG. 1, hatching is omitted for some components for easy understanding. In the present exemplary embodiment, the upward and downward direction in FIG. 1, which is indicated by the direction indicated by arrow II or the reverse direction, is assumed as the vertical direction in the plasma processing apparatus.

Referring to FIGS. 1 and 2, the plasma processing apparatus 11 performs a processing using plasma on a processing target substrate W which is an object to be processed. Specifically, a processing such as, for example, etching, CVD, or sputtering, is performed. The processing target substrate W may be, for example, a silicon substrate used for manufacturing semiconductor elements.

The plasma processing apparatus 11 includes a processing container 12 configured to perform therein a processing on a processing target substrate W by plasma, a gas supply unit 13 configured to supply a gas for plasma excitation or plasma processing into the processing container 12, a disc-shaped holding stage 14 provided in the processing container 12 to hold the processing target substrate W thereon, a plasma generating mechanism 19 configured to generate plasma in the processing container 12 using microwaves, and a control unit 15 configured to control the operations of the entire plasma processing apparatus 11. The control unit 15 controls the entire plasma processing apparatus 11, including, for example, a gas flow rate in the gas supply unit 13 and a pressure within the processing container 12.

The processing container 12 includes a bottom portion 21 positioned blow the holding stage 14 and a side wall 22 extending upwardly from the outer circumference of the bottom portion 21. The side wall 22 has substantially a cylindrical shape. An exhaust port 23 for evacuation is formed through a part of the bottom portion 21 of the processing container 12. The top side of the processing container 12 is opened. The container 12 is configured to be sealable by a cover portion 24 disposed on the top side of the processing container 12, a dielectric window 16 (described below), and an O-ring 25 interposed between the dielectric window 16 and the cover portion 24 as a seal member.

The gas supply unit 13 includes a first gas supply section 26 configured to spray a gas toward the center of the processing target substrate W, and a second gas supply section 27 configured to spray a gas from the outside of the processing target substrate W. A gas supply hole 30a configured to supply the gas in the first gas supply section 26 is formed at a position which corresponds to the radial center of the dielectric window 16 and is retreated to the inside of the dielectric window 16 from the bottom surface 28 of the dielectric window 16 which faces the holding stage 14. The first gas supply section 26 supplies an inert gas for plasma excitation or a gas for plasma processing while adjusting, for example, a flow rate, by a gas supply system 29 connected to the first gas supply section 26. The second gas supply section 27 is formed by providing a plurality of gas supply holes 30b configured to supply an inert gas for plasma excitation or a gas for plasma processing into the processing container 12 in a portion at the upper side of the side wall 22. The plurality of gas supply holes 30b are formed at regular intervals in the circumferential direction. The first gas supply section 26 and the second gas supply section 27 are supplied with the same kind of inert gas for plasma excitation or gas for plasma processing from the same gas supply source. Meanwhile, different gases may be supplied from the first gas supply section 26 and the second gas supply section 27 and the flow rates thereof may be adjusted, according to request or control contents.

A high frequency power supply 38 for radio frequency (RF) bias is electrically connected to the holding stage 14, in particular, to an electrode within the holding stage 14 via a matching unit 39. The high frequency power supply 38 may output high frequency waves of, for example, 13.56 MHz with a predetermined power (bias power). The matching unit 39 accommodates a matcher for matching the high frequency power supply 38 side impedance and a load side impedance which mainly includes, for example, the electrode, the plasma and the processing container 12, and a blocking capacitor for self-bias generation is included in the matcher. Meanwhile, during the plasma processing, the bias voltage may be or may not be supplied to the holding stage 14 as necessary.

The holding stage 14 is capable of holding the processing target substrate W thereon using an electrostatic chuck (not illustrated). In addition, the holding stage 14 may include, for example, a heater for heating (not illustrated) in which the temperature of the heater may be set to a desired temperature by a temperature adjustment mechanism 33 provided inside the holding stage 14. The holding stage 14 is supported by an insulative cylindrical support 31 which extends vertically upwardly from the lower side of the bottom portion 21. The exhaust port 23 described above is formed through a part of the bottom portion 21 of the processing container 12 around the outer circumference of the cylindrical support 31. An exhaust apparatus (not illustrated) is connected to the bottom side of the annular exhaust port 23 via an exhaust pipe (not illustrated). The exhaust apparatus includes a vacuum pump such as, for example, a turbo molecular pump. The inside of the processing container 12 may be decompressed to a predetermined pressure by the exhaust apparatus.

The plasma generating mechanism 19 includes a microwave generator 41 provided outside of the processing container 12 and serving as a high frequency generator for generating microwaves for plasma excitation. In addition, the plasma generating mechanism 19 includes a dielectric window 16 disposed at a position opposite to the holding stage 14 so as to introduce the microwaves generated by the microwave generator 41 into the processing container 12. In addition, the plasma generating mechanism 19 includes a slot antenna plate 17 that includes a plurality of slot holes 20 formed therein and is disposed on the top side of the dielectric window 16 so as to radiate the microwaves to the dielectric window 16. Further, the plasma generating mechanism 19 includes a dielectric member 18 disposed on the top side of the slot antenna plate 17 so as to propagate the microwaves introduced thereto in the radial direction by a coaxial waveguide 36 to be described later.

The microwave generator 41 is connected to the upper portion of the coaxial waveguide 36 configured to introduce microwaves, via a mode converter 34 and a waveguide 35a. For example, microwaves of a TE mode generated by the microwave generator 41 pass through the waveguide 35a to be converted into a TEM mode by the mode converter 34, and the microwaves converted into the TEM are propagated through the coaxial waveguide 36. The detailed configuration of the microwave generator 41 will be described below. Meanwhile, the waveguide 35a side with respect to the microwave generator 41 becomes the load side to be described later.

The dielectric window 16 has substantially a disc shape and is made of a dielectric material. An annular recess 37 is formed on a part of the bottom surface 28 of the dielectric window 16, in which the annular recess 37 is recessed in a tapered shape so as to facilitate generation of standing waves by the microwaves introduced thereto. With the help of the recess 37, the plasma may be efficiently generated by the microwaves at the bottom side of the dielectric window 16. Meanwhile, the specific material of the dielectric window 16 may be, for example, quartz or alumina.

The slot antenna plate 17 is thin and has a disc shape. As illustrated in FIG. 2, a plurality of slot holes 20 are formed such that every two slot holes 20 are orthogonal to each other at a predetermined space therebetween so as to form a slot hole pair, and a plurality of slot hole pairs are formed to be spaced apart from each other in the circumferential direction. In addition, the plurality of slot hole 20 pairs are also formed to be spaced apparat from each other in the radial direction.

The microwaves generated by the microwave generator 41 are propagated to the dielectric member 18 through the coaxial waveguide 36. The microwaves are spread toward the outside in the radial direction in the inside of the member 18 sandwiched between and the slot antenna plate 17 and the cooling jacket 32, and radiated from the plurality of slot holes 20 formed in the slot antenna plate 17 to the dielectric window 16, in which the cooling jacket 32 includes a circulation path 40 therein so as to circulate, for example, a coolant to perform the temperature adjustment of, for example, the dielectric member 18. The microwaves transmitted through the dielectric window 16 generate an electric field just below the dielectric window 16 so as to generate plasma within the processing container 12.

When the microwave plasma is generated in the plasma processing apparatus 11, a so-called plasma generation region in which the electron temperature is relatively high is formed just below the bottom surface 28 of the dielectric window 16, more specifically, in a region poisoned about several centimeters below the bottom surface 28 of the dielectric window 16. In addition, in a region positioned below the plasma generation region, a so-called plasma diffusion region is formed in which the plasma generated in the plasma generation region is diffused. The plasma diffusion region is a region where the electron temperature of the plasma is relatively low, and the plasma processing is performed in this region. Then, the processing target substrate W is not subjected to so-called plasma damage during the plasma processing, and due to the high electron density of the plasma, the plasma processing may be efficiently performed.

The plasma generating mechanism 19 is configured to include the dielectric window 16 that transmits high frequency waves generated by a magnetron serving as a high frequency oscillator as described below to the inside of the processing container 12, and the slot antenna plate 17 that includes the plurality of slot holes 20 formed therein to radiate the high frequency waves to the dielectric window 16. In addition, the plasma generating mechanism 19 is configured such that the plasma generated by the plasma generating mechanism 19 is generated by the radial line slot antenna.

Here, descriptions will be made on a specific configuration of the microwave generator 41 included in the plasma generating mechanism 19 provided in the plasma processing apparatus 11.

Figure 3:
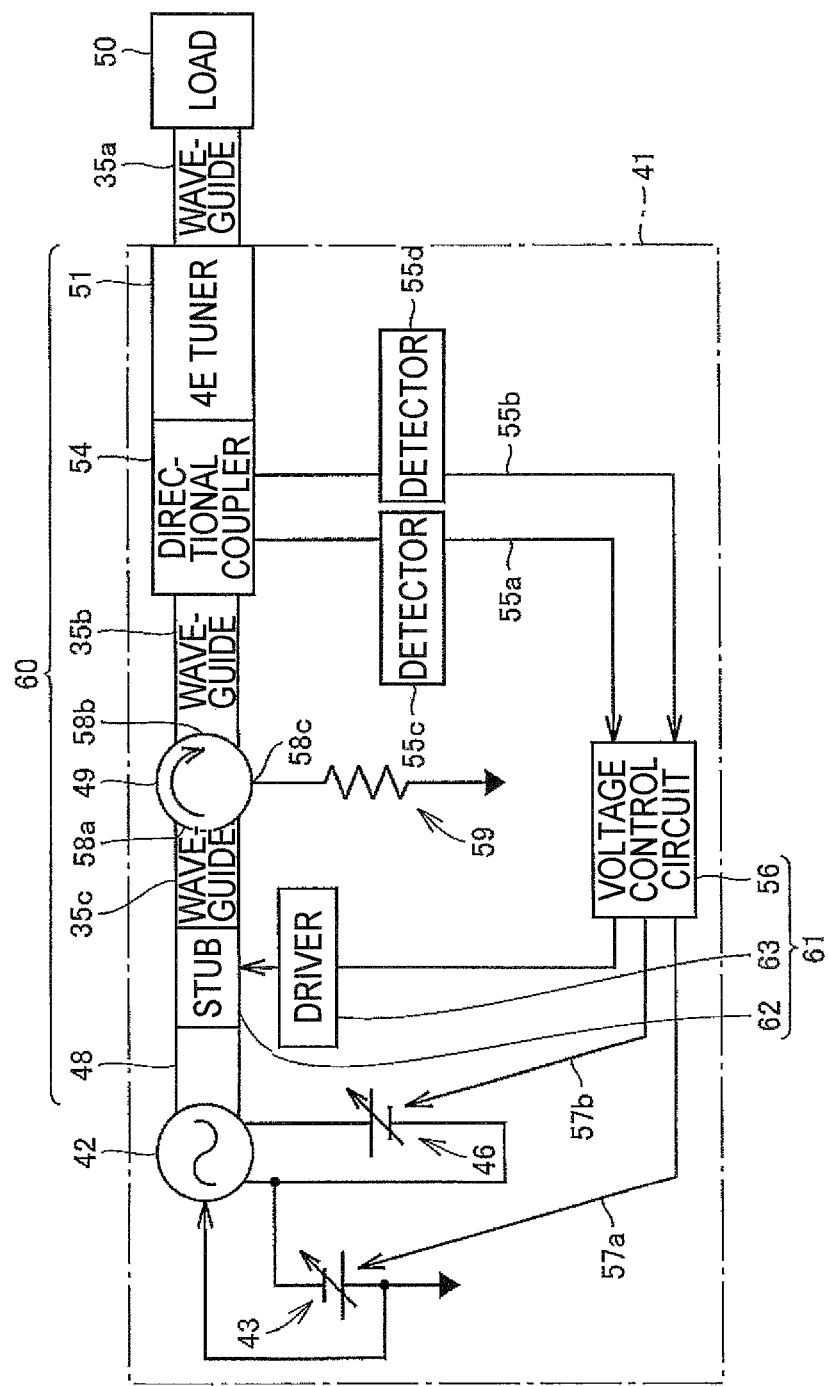
FIG. 3 is a block diagram illustrating a schematic configuration of a microwave generator included in the plasma processing apparatus illustrated in FIG. 1.
Figure 4:
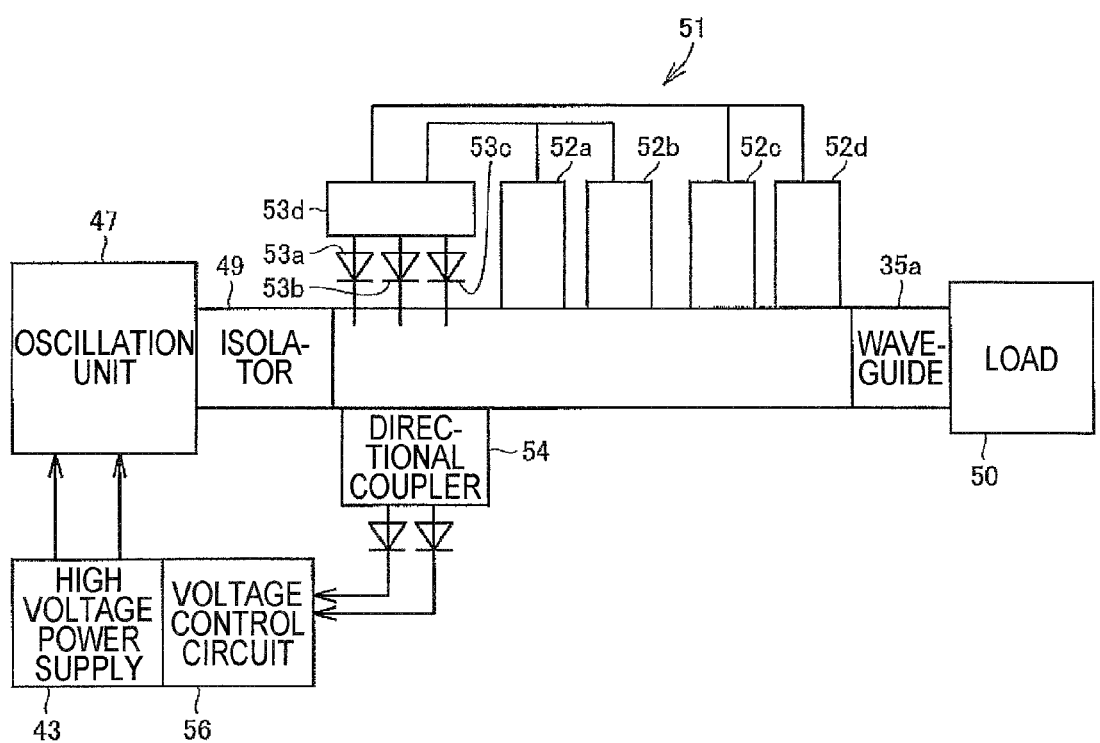
FIG. 4 is a schematic view illustrating a configuration around a 4E tuner included in the microwave generator.
Figure 5:
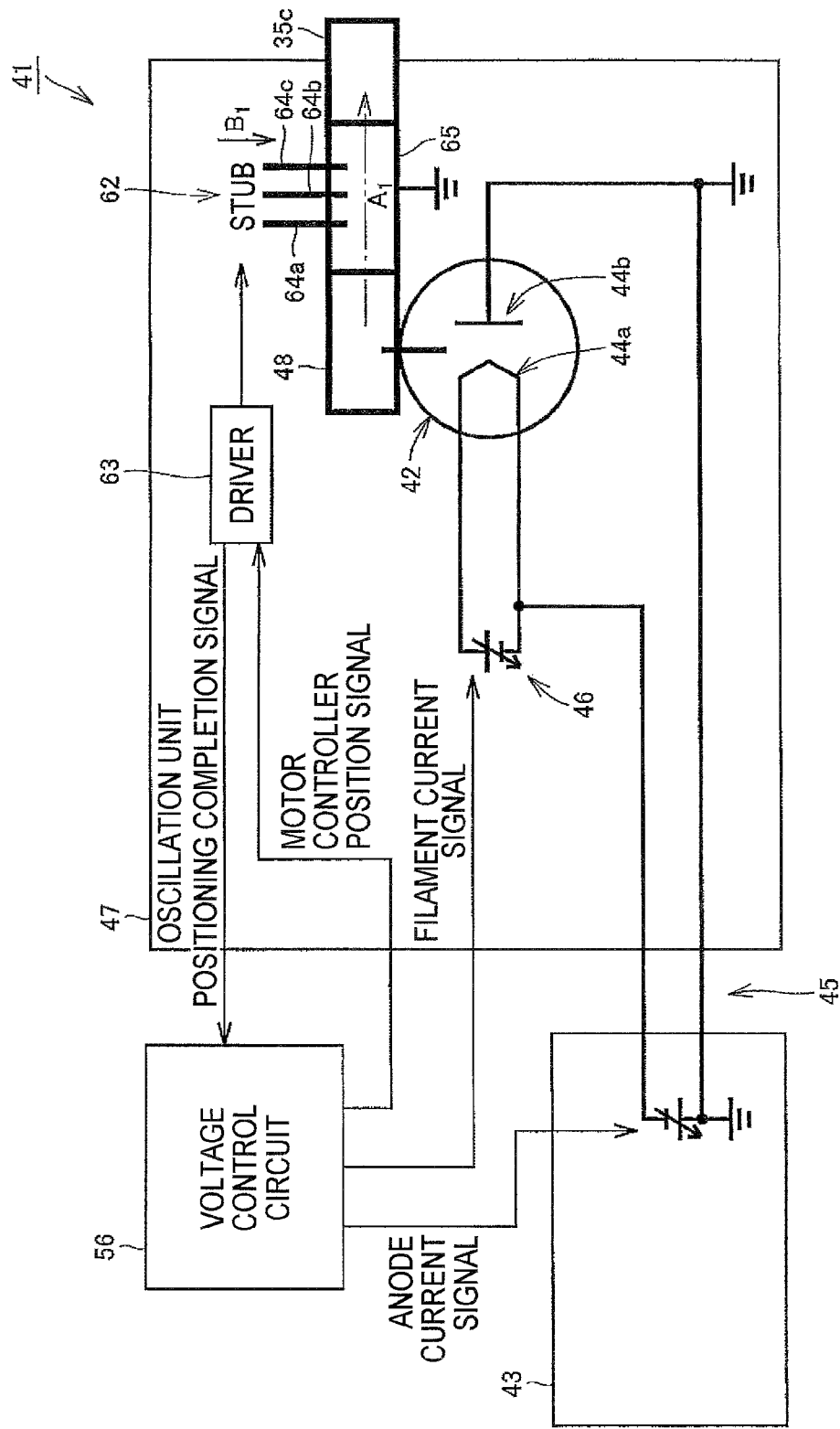
FIG. 5 is a schematic view illustrating a configuration around a magnetron included in the microwave generator.

FIG. 3 is a block diagram illustrating a schematic configuration of the microwave generator 41. FIG. 4 is a schematic view illustrating a configuration around a 4E tuner serving as a matching device (described later) included in the microwave generator 41. FIG. 5 is a schematic view illustrating a configuration around a magnetron included in the microwave generator 41.

Referring to FIGS. 1 to 5, the microwave generator 41 includes a magnetron 42 serving as a high frequency oscillator configured to oscillate microwaves as high frequency waves, a high voltage power supply 43 configured to supply a power to the magnetron 42, and a filament power supply 46 configured to supply a power to a filament that constitutes a cathode electrode 44a when oscillating the high frequency waves. The high voltage power supply 43 and the filament power supply 46 constitute a power supply unit that supplies a power to the magnetron 42. The oscillation unit 47 includes the magnetron 42 and a launcher 48 from which the microwaves oscillated by the magnetron 42 are taken out. The microwaves oscillated form the magnetron 42 travel in a direction of arrow $A_1$ indicated by a two-dot chain line in FIG. 5. Meanwhile, reflected waves of the microwaves travel in a direction opposite to arrow $A_1$ in FIG. 5. In addition, the microwave generator 41 includes a waveguide path 60 configured to propagate the microwaves oscillated by the magnetron 42 to the processing container 12 side which becomes the load side. The waveguide path 60 serves as a passage in which the microwaves are propagated, and is mainly constituted with, for example, the launcher 48, a waveguide 35b that interconnects an isolator and a directional coupler (which are described later), and a waveguide 35c that interconnects a stub mechanism and the isolator.

A circuit 45 is interposed between the magnetron 42 and the high voltage power supply 43. An anode current is supplied from the high voltage power supply 43 side to the magnetron 42 side through the circuit 45. In the inside of the magnetron 42, a filament is incorporated in the circuit 45. Microwaves output to the outside are generated by a cathode electrode 44a constituted by the filament and an anode electrode 44b formed by being supplied with the anode current from the high voltage power supply 43. Meanwhile, for example, the filament that becomes the cathode side constituting the cathode electrode 44a and the anode vane forming the anode electrode 44b that becomes the anode electrode 44b are machined products which are manufactured by machining.

In addition, the microwave generator 41 includes an isolator 49, a directional coupler 54 provided in the waveguide path 60 so as to branch some of travelling waves travelling inside the waveguide path 60 and reflected waves from the load side, and a 4E tuner 51 serving as a matcher. The isolator 49 transmits a frequency signal in one direction from the magnetron 42 to the 4E tuner 51 side positioned at the load 50 side. The load 50 mentioned here refers to members positioned at the downstream side of the waveguide 35a such as, for example, a mode converter 34.

The 4E tuner 51 includes four movable short-circuit units 52a, 52b, 52c, 52d provided in the traveling direction of the microwaves to be spaced apart from each other, in which each movable short-circuit unit includes a movable short-circuit plate (not illustrated), and three probes 53a, 53b, 53c at the magnetron 42 side with respect to the movable short-circuit unit 52a. The three probes 53a, 53b, 53c are provided to be spaced apart from each other by a distance of ⅛ of a guide wavelength λg, i.e. by λg/8 in the travelling direction of the microwaves. In addition, the positions of the movable short-circuit plates (not illustrated), which respectively correspond to the three probes 53a, 53b, 53c, are calculated by an arithmetic operation circuit 53d connected to the three probes 53a, 53b, 53c. Meanwhile, the guide wavelength of the waveguide refers to a wavelength in the travelling direction of the waveguide which is calculated based on a set fundamental frequency and a size of the waveguide. For example, when a vertical length and a horizontal length of the waveguide are respectively 96 mm and 27 mm at 2.45 GHz, the guide wavelength is calculated as 158 mm.

In addition, the directional coupler 54 is provided on the 4E tuner 51 at the magnetron 42 side with respect to the movable short-circuit unit 52a. The directional coupler 54 is a bi-directional coupler. Meanwhile, the directional coupler 54 may not be opposite to the three probes 53a, 53b, 53c. The power signal of travelling waves travelling in the inside of the waveguide path 60 is transmitted to a voltage control circuit 56 provided in the microwave generator 41 through a circuit 55a, using the directional coupler 54. Meanwhile, the power signal of the travelling waves transmitted through the circuit 55a is detected as a travelling wave power signal by a detector 55c in an analog manner. In addition, a power signal of reflected waves travelling inside waveguide path 60 is transmitted to the voltage control circuit 56 provided in the microwave generator 41 through a circuit 55b, using the directional coupler 54. Meanwhile, the power signal of the reflected waves transmitted through the circuit 55b is as a reflected wave power signal by a detector 55d in an analog manner. A control signal of the voltage supplied by the high voltage power supply 43 and a control signal of the voltage supplied by the filament power supply 46 are transmitted from the voltage control circuit 56 using a circuit 57a and a circuit 57b so as to perform a control of a voltage applied to the magnetron 42. That is, in order to assure that the set power becomes equal to the travelling wave power detected from the directional coupler 54, the voltage control circuit 56 supplies a voltage to the high voltage power supply 43 and the filament power supply 46 so that a proper current satisfying a specification of the magnetron 42 may be applied.

Meanwhile, the isolator 49 provided between the magnetron 42 and the 4E tuner 51 is configured by setting a terminal of one of circulators which are passive elements as a dummy load 59. That is, the isolator 49 is configured by connecting a first terminal 58a positioned at the magnetron 42 side with the oscillation unit, connecting a second terminal 58b positioned at the 4E tuner 51 side with the 4E tuner 51, and connecting the dummy load 59 to the remaining third terminal 58c. In this way, the isolator 49 may transmit a power in one direction from the magnetron 42 to the 4E tuner 51 positioned at the load 50 side. In addition, the isolator 49 may transmit the power reflected from the load 50 to the 4E tuner 51, to the dummy load 59. That is, the power reflected from the load 50 may be prevented from being transmitted to the magnetron 42. Then, the magnetron 42 may be prevented from being troubled by the reflected power.

Here, the microwave generator 41 includes a voltage standing wave ratio variable mechanism 61 configured to vary a voltage standing wave ratio (VSWR) of voltage standing waves formed in the waveguide path 60 by the microwaves, depending on the power supplied from the power supply unit.

Next, descriptions will be made on the details of the voltage standing wave ratio variable mechanism 61. The voltage standing wave ratio variable mechanism 61 includes a stub mechanism 62 including three rod-shaped members 64a, 64b, 64c provided on the waveguide path 60 to be movable in the radial direction, a driver 63 configured to move the rod-shaped members 64a, 64b, 64c, and a control mechanism configured to control the movement of the rod-shaped members 64a, 64b, 64c. The stub mechanism 62 constitutes a part of the waveguide path 60, and the rod-shaped member 64a, 64b, 64c are provided on the waveguide path 65 that constitutes the stub mechanism 62. In the present exemplary embodiment, the voltage control circuit 56 also serves as the control mechanism.

Each of the three rod-shaped members 64a, 64b, 64c is extendible from the outer circumference side of the waveguide path 60 toward the inner circumference side. In addition, the three rod-shaped members 64a, 64b, 64c may be moved in the reverse direction. That is, the three rod-shaped members 64a, 64b, 64c may be moved in the direction indicated by arrow $B_1$ or in the reverse direction. The three rod-shaped members 64a, 64b, 64c are individually moved by the driver 63 that drives a motor (not illustrated). The movements of the rod-shaped members 64a, 64b, 64c are controlled by the voltage control circuit 56 which also serves as the control mechanism.

Figure 9:
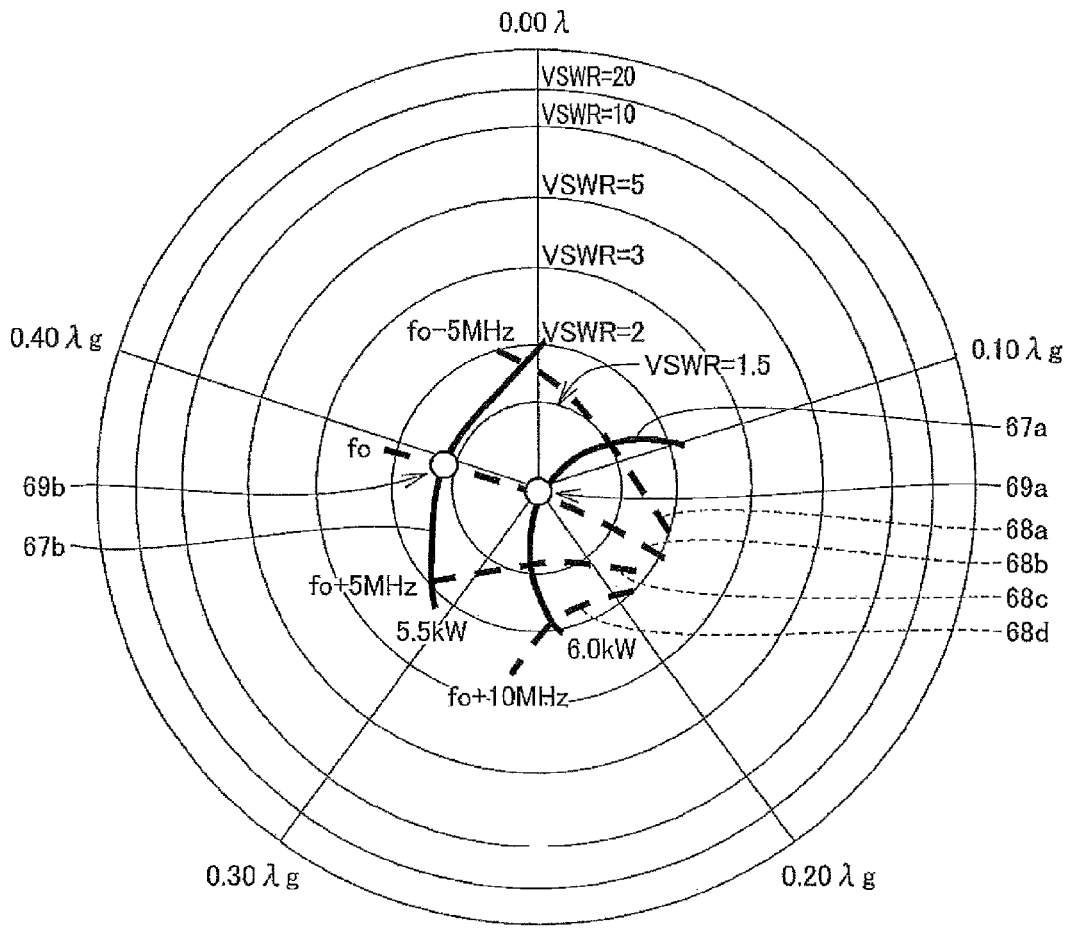
FIG. 9 is a Rieke diagram of an arbitrary magnetron.

That is, the relationship between a VSWR by the voltage standing wave ratio variable mechanism 61 and a phase is determined uniquely based on a distance from the magnetron 42 to the stub mechanism 62, the interval of the rod-shaped members 64a, 64b, 64c, and the extending height of the rod-shaped members 64a, 64b, 64c. As illustrated in FIG. 9 described later, in the magnetron 42, when the VSWR is determined based on the specification of the magnetron 42, the proper position of the phase is uniquely determined. Thus, when the VSWR is established, it is considered that the phase is set to a proper value.

Meanwhile, although three rod-shaped members 64a, 64b, 64c are provided in the present exemplary embodiment, one rod-shaped member may be provided. Otherwise, a plurality of (e.g., three or more) rod-shaped members may be provided.

Figure 6:
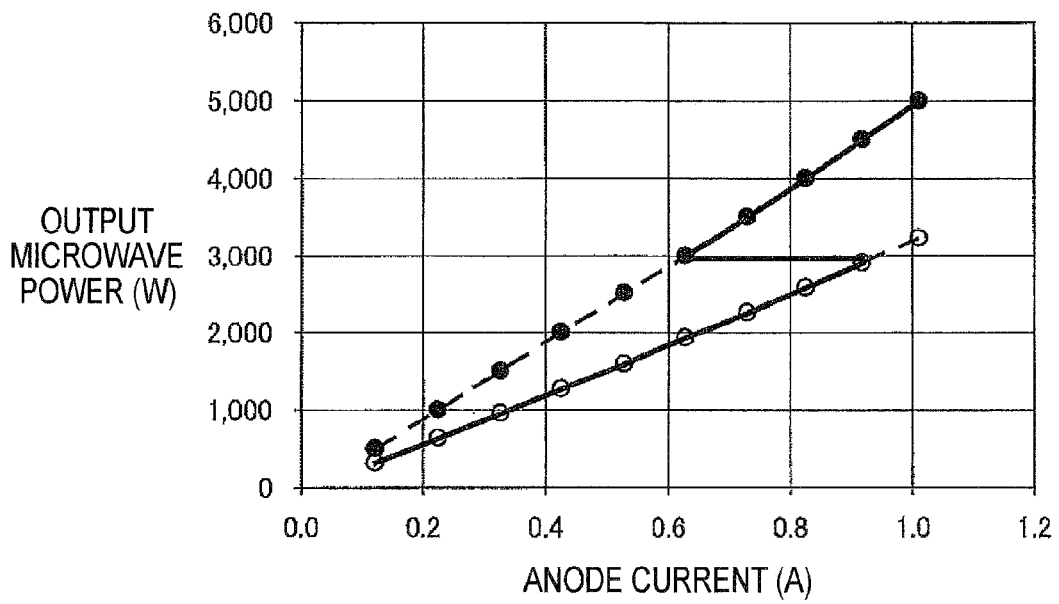
FIG. 6 is a graph representing a relationship between an anode current and an output microwave power when a VSWR was set to 1.5 and a relationship between the anode current and the output microwave power when the VSWR was set to 7.0 in a magnetron.

Here, descriptions will be made on the operation of the voltage standing wave ratio variable mechanism 61. FIG. 6 illustrates a graph representing a relationship between an anode current and an output microwave power when the VSWR was set to 1.5 and a relationship between the anode current and the output microwave power when the VSWR was set to 7.0 in a magnetron. The horizontal axis represents an anode current (A) and the vertical axis represent an output microwave power (W). In addition, the graph indicated by black circles and a dotted line represents the relationship between the anode current and the output microwave power when the VSWR was set to 1.5 in the magnetron 42, and the graph indicated by white circles and a dotted line represents the relationship between the anode current and the output microwave power when the VSWR was set to 7.0 in the magnetron 42. Meanwhile, as a predetermined value for varying the VSWR, the output microwave power value is set to 3000 W.

When a set microwave power value is input to the voltage control circuit 56, the rod-shaped members 64a, 64b, 64c included in the stub mechanism 62 are driven to a predetermined position through the driver 63 by a motor controller position signal existing in the voltage control circuit 56 such that the VSWR becomes a value set in advance. Next, a power is supplied to the high voltage power supply 43 and the filament power supply 46, and microwaves are oscillated by the magnetron 42. Then, a travelling wave power signal and a reflected wave power signal are input to the voltage control circuit 56 from the directional coupler 54.

Here, it is assumed that the output microwave power is varied to be lowered from, for example, 4000 W, in a process condition in the plasma processing apparatus 11. When the output microwave power is 4000 W, the VSWR is adjusted to be 1.5. Here, the output microwave power is lowered. In addition, when the output microwave power is lowered and becomes 3000 W, the VSWR becomes 7.0.

The extending heights of the rod-shaped members 64a, 64b, 64c corresponding to the cases where the VSWR is 1.5 and where the VSWR is 7.0 are stored in advance in the voltage standing wave ratio variable mechanism 61. In addition, a motor controller position signal is transmitted to the driver 63. Then, the driver 63 drives the motor according to the signal so as to move the rod-shaped members 64a, 64b, 64c. In addition, the rod-shaped members 64a, 64b, 64c are positioned at the calculated positions. Thereafter, a positioning completion signal is transmitted from the driver 63 to the voltage control circuit 56. In this way, the value of the VSWR is varied by the stub mechanism 62. That is, when the power supplied to the magnetron 42 from the power supply unit is lower than 3000 W, a control is performed to increase the VSWR to 7.0. Meanwhile, the specific relationship between the output microwave power and the anode current according to the variation of the VSWR is represented by a solid line in FIG. 6. In this way, the voltage control circuit 56 varies the VSWR according to a set microwave power value by the stub mechanism 62 provided in the voltage standing wave ratio variable mechanism 61.

With the configuration described above, in a fundamental frequency waveform, a skirt shape at a peak may be narrowed to make the peak steep. That is, even with a low power, an ideal fundamental frequency waveform may be obtained. In this case, when the fundamental frequency waveform has a steep peak and a narrow skirt region at the peak, formation of stable standing waves and formation a stable electromagnetic field based on the formation of the stable standing waves can be performed, for example, in the matching process with plasma load thereafter even if the position of the peak is slightly different. Then, stable and uniform plasma may consequently be generated within the processing container 12, and further, the influence caused by a machine difference may be reduced. Accordingly, even if the power set in the magnetron is low when the plasma processing is performed, stable plasma may be generated. As a result, more stable plasma may be generated over a broad region from a low power to a high power and a wide process condition may be established. That is, a process may be established not only at a high power but also at a low power in the microwave generator 41 provided in the plasma processing apparatus 11.

Figure 31:
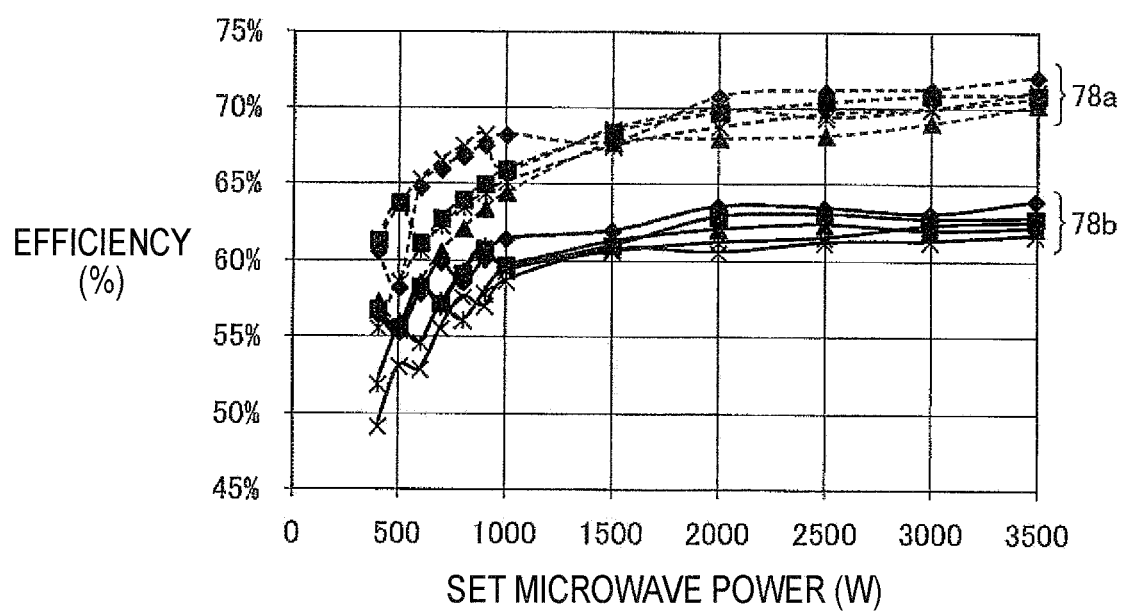
FIG. 31 is a graph representing a relationship between a set microwave power and efficiency.

Here, when the VSWR is increased, the efficiency tends to decrease as illustrated in FIG. 31. The variation of VSWR is also performed to be balanced with the efficiency.

Meanwhile, for example, descriptions will be made on a parameter serving as an index when a VSWR is varied by the voltage standing wave ratio variable mechanism 61, and the variation of a fundamental frequency waveform when the VSWR is varied with reference to FIG. 7 and the following drawings.

First, descriptions will be made on a precision calculated from a difference between a microwave power and a high precision power meter will be described. FIG. 7 is a graph representing a relationship between a set microwave power and a precision of an output microwave power when the VSWR is 1.5. In FIG. 7, the horizontal axis represents a set microwave power (W) and the vertical axis represents a precision of an output microwave power (%). The precision of an output microwave power refers to an index indicating the practical level of errors among microwave generators with respect to a microwave power supplied based on the set microwave wave power when the number of tests is 100 (n=100). A line 66a represents a mean error value, a line 66b represents a maximum error value, and a line 66c represents a minimum error value.

Figure 7:
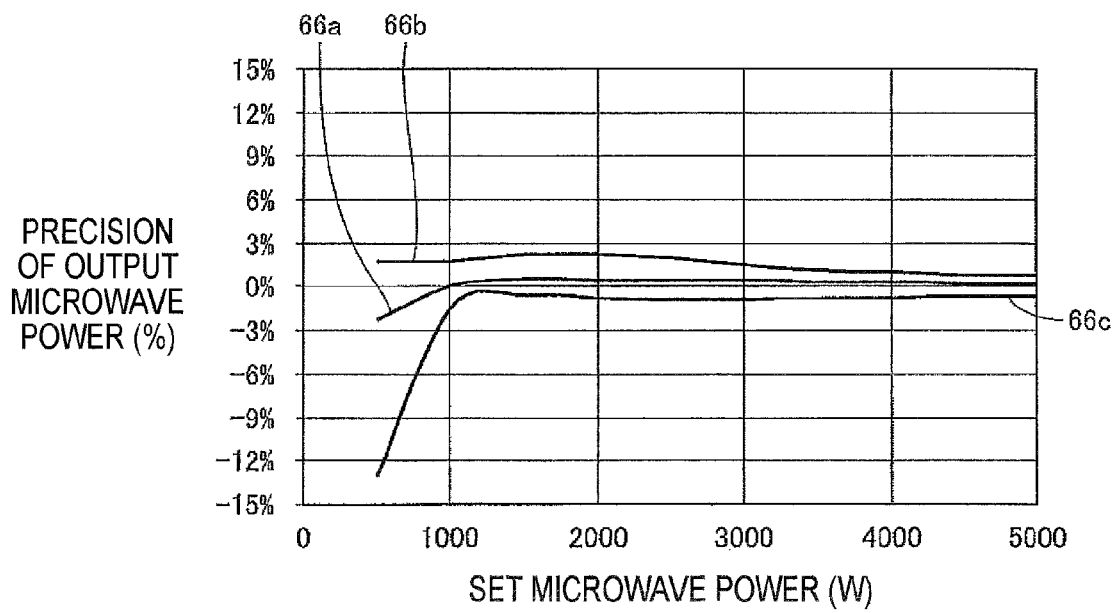
FIG. 7 is a graph representing a relationship between a set microwave wave and precision of an output microwave power.

Referring to FIG. 7, in the region where the set microwave power is higher than 1000 W, the mean error value, the maximum error and the minimum error exhibit approximately exhibit constant values, respectively. However, in the region where the set microwave power is lower than 1000 W, the difference between the maximum error value and the minimum error value increases as the set microwave power (W) decreases from 1000 V. In this situation, the basic frequency waveforms are fluctuated, the heights of the peaks are lowered, and the skirt areas of peaks are widened. Accordingly, in such a case, the VSWR may be varied with reference to the output microwave power of 1000 W as one standard. That is, 1000 W may be set as the predetermined value for varying the VSWR.

For reference, when the set microwave power is set to be excessively low, the oscillation mode jumps so that a phenomenon so-called moding occurs to vary an oscillation frequency, which may cause an unstable oscillation state. However, even if the set microwave power is set to be low, the moding is hardly generated by increasing the anode current. Accordingly, the case in which the set microwave power is set to be low is handled in this manner.

Figure 8:
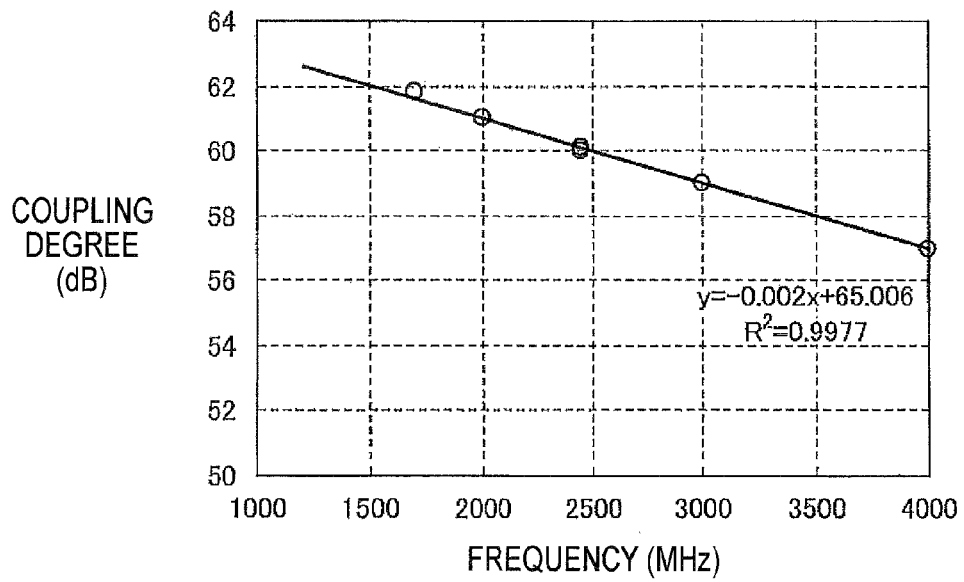
FIG. 8 is a graph representing a frequency dependency of coupling degree of a directional coupler.

Next, descriptions will be made on a frequency dependency of coupling degree of the directional coupler 54. FIG. 8 is a graph representing a frequency dependency of coupling degree of the directional coupler. The horizontal axis represents a frequency (MHz) and the vertical axis represents a coupling degree (dB). Referring to FIG. 8, in the case where setting is performed such that the coupling degree becomes 60 dB when the frequency is 2450 MHz, the coupling degree becomes 62 dB when the frequency is 1500 MHz, and the coupling degree becomes 59 dB when the frequency is 3000 MHz. That is, in the directional coupler, when the frequency is varied, the detected power is varied. In such a case, as the frequency increases, the coupling degree decrees. Meanwhile, the positional transition caused by the machine difference or use of the magnetron 42 is about 10 MHz, which has little influence on the coupling degree.

Here, descriptions will be made on calculation of a proper wavelength in an arbitrary magnetron. FIG. 9 is a Rieke diagram of an arbitrary magnetron. The Rieke diagram is a chart on which curves of constant oscillation frequency and constant power output are drawn. The oscillation frequency and power output are measured simultaneously with reading magnitudes and positions of minimum points of outstanding wave ratios on a line while varying a load state while the anode voltage, anode current and magnetic field of the magnetron remain constant. In FIG. 9, solid lines 67a, 67b represent power output-constant curves, and dotted lines 68a, 68b, 68c, 68d represent frequency-constant curves. The solid line 67a corresponds to a case in which the output power is 6.0 kW, and the solid line 67b corresponds to a case where the power output is 5.5 kW. In addition, the dotted line 68a corresponds to a case where the frequency is fo (fundamental frequency)−5 (MHz), the dotted line 68b corresponds to a case where the frequency is fo (fundamental frequency), the dotted line 68c corresponds to a case where the frequency corresponds to fo (fundamental frequency)+5 (MHz), and the dotted line 68d corresponds to a case where the frequency fo (fundamental frequency)+10 (MHz). In addition, at a point 69a which is an intersection point of the solid line 67a and the dotted line 68b and the VSWR is 1.0. At a point 69b which is an intersection point of the solid line 67b and the dotted line 68b, the VSWR is 1.6. In the magnetron 42, when the wavelength becomes 0.40 λg, the point 69a and the point 69b are positioned most closely to the center. Accordingly, the proper wavelength in the magnetron 42 is 0.40 λg. In addition, the wavelength is fixed to 0.40 λg and the VSWR is changed. Meanwhile, when the guide wavelength λg is set to 158 mm, 0.40 λg becomes about 63.2 mm.

Figure 10:
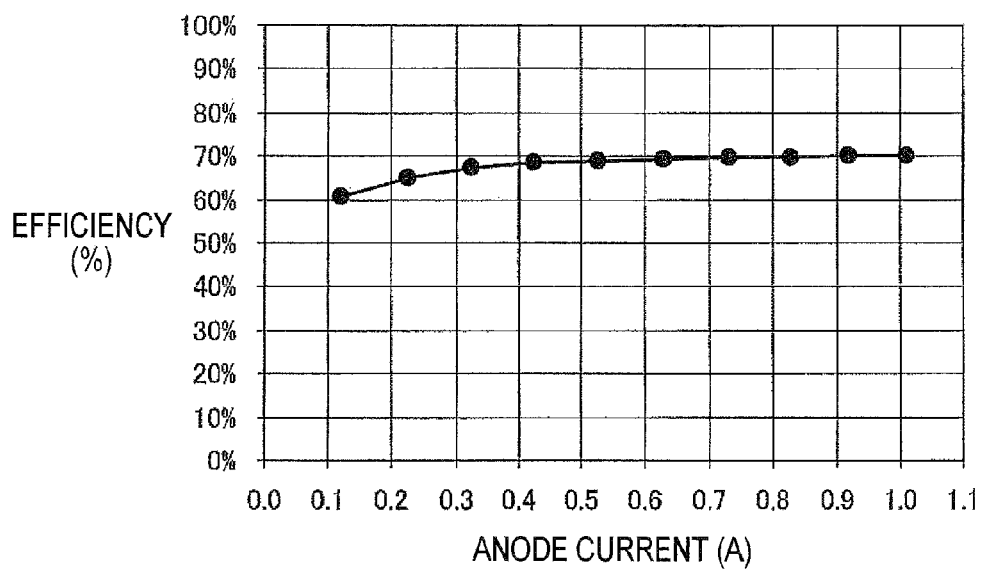
FIG. 10 is a graph representing a relationship between an anode current and efficiency.

Next, descriptions will be made on a relationship between an anode current and efficiency. FIG. 10 is a graph representing a relationship between an anode current and efficiency. The horizontal axis represents an anode current (A) and the vertical axis represents efficiency (%). Here, the number of tests is 100 (n=100). Referring to FIG. 10, when the anode current decreases, the efficiency tends to decreases, and in the range where the anode current is low, the tendency is remarkable. Accordingly, in order to maintain a high efficiency, it is desirable that the anode currency is high.

Figure 11:
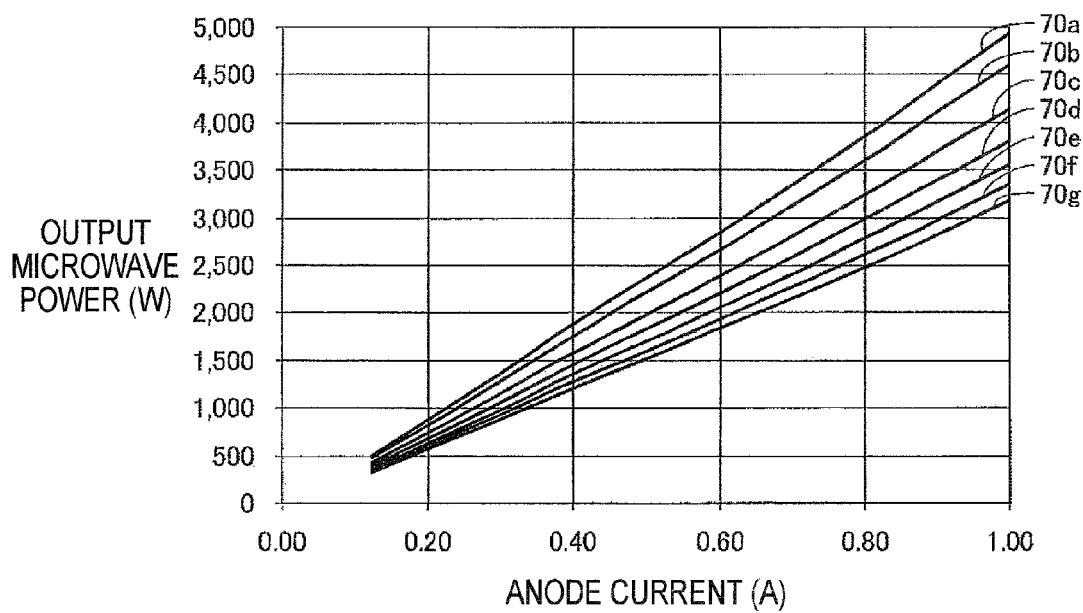
FIG. 11 is a graph representing a relationship between an anode current and an output microwave power when a VSWR is varied.

Next, descriptions will be made on a relationship between an anode current and an output microwave power when a VSWR is varied. FIG. 11 is a graph representing a relationship between an anode current and an output microwave power when a VSWR is varied. The horizontal axis represents an anode current (A), and the vertical axis represents an output microwave power (W). The VSWR shows each of values of 1.5, 2.0, 3.0, 4.0, 5.0, 6.0, and 7.0, which are indicated by lines 70a, 70b, 70c, 70d, 70e, 70f, 70g, respectively. Referring to FIG. 10, it may be understood that when the VSWR value is low, the output microwave power is high even if the anode current has the same value.

Figure 12:
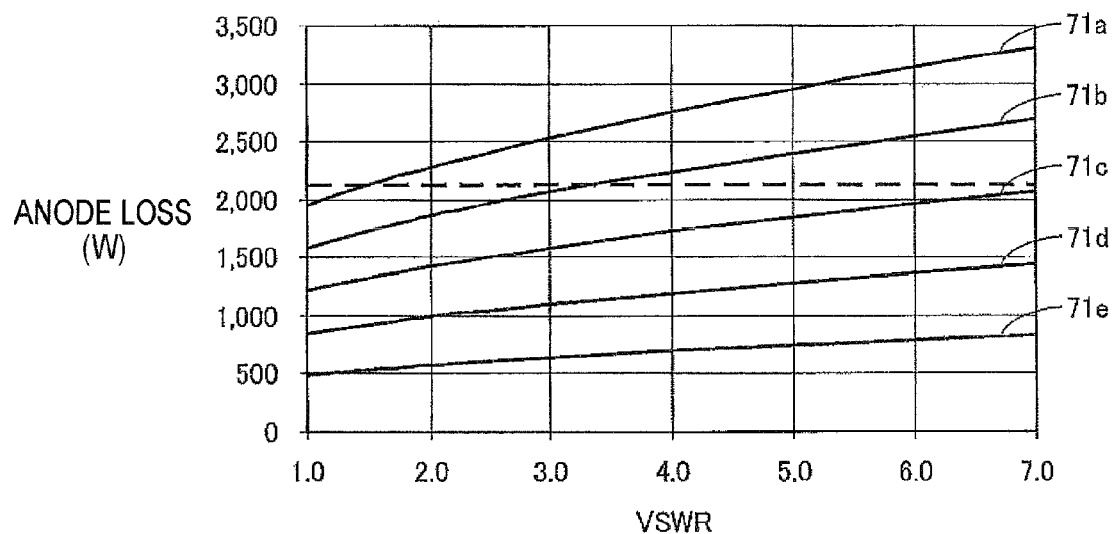
FIG. 12 is a graph representing a relationship between a VSWR and anode loss.

Next, descriptions will be made on a relationship between a VSWR and anode loss when the anode current is varied. FIG. 12 is a graph representing a relationship between a VSWR and anode loss. The horizontal axis represents a VSWR and the vertical axis represents anode loss (W). the anode current shows each of values 1.01(A), 0.83(A), 0.63 (A), 0.43(A), and 0.23(A) which are indicated by lines 71a, 71b, 71c, 71d, 71e, respectively. Referring to FIG. 12, it is desirable that the anode loss is as small as possible. When the anode current is high, the anode loss tends to increase. In addition, even if the anode value is constant, the anode loss tends to slightly increase as the value of VSWR increases. Meanwhile, the intersection point of the line 71a and the dotted line indicates the anode loss when the VSWR is 1.5 and the output microwave power is 5000 W. The dotted line indicates a tolerable maximum value of the anode loss when the VSWR is 1.5 and the output microwave power is 5000 W. In the region below the dotted line in the graph, the calorific value caused by the anode loss is lower than that caused by the tolerable maximum anode loss. Thus, the life time affected by the anode loss is equal to or longer than the life time affected by the tolerable maximum anode loss.

Figure 13:
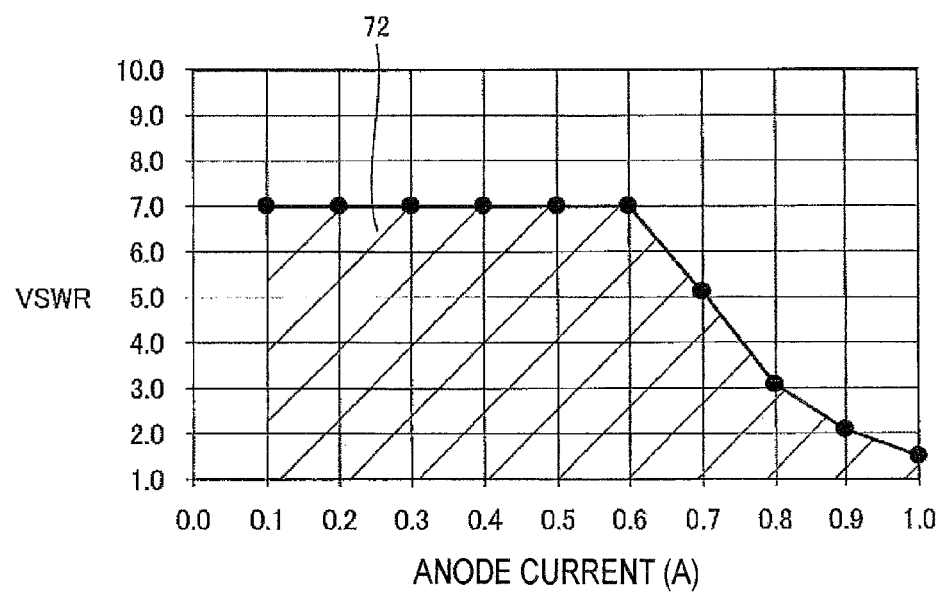
FIG. 13 is a graph representing an anode current and a VSWR range which may be set.

Next, descriptions will be made on a relationship between an anode current and a VSWR in relation to a tolerable value of anode loss. FIG. 13 is a graph representing a VSWR range which may be set with respect to an anode current. The horizontal axis represents an anode current (A) and the vertical represents a VSWR. Here, the maximum tolerable VSWR value is indicated as 7.0. Referring to FIG. 13, it may be understood that as the anode current increases, the tolerable VSWR value decreases, and when the anode current is 1.0 A, even the VSWR value of 2 is not tolerable. A proper VSWR value is selected in the region 72 indicated by hatching in the lower portion of the graph.

Figure 14:
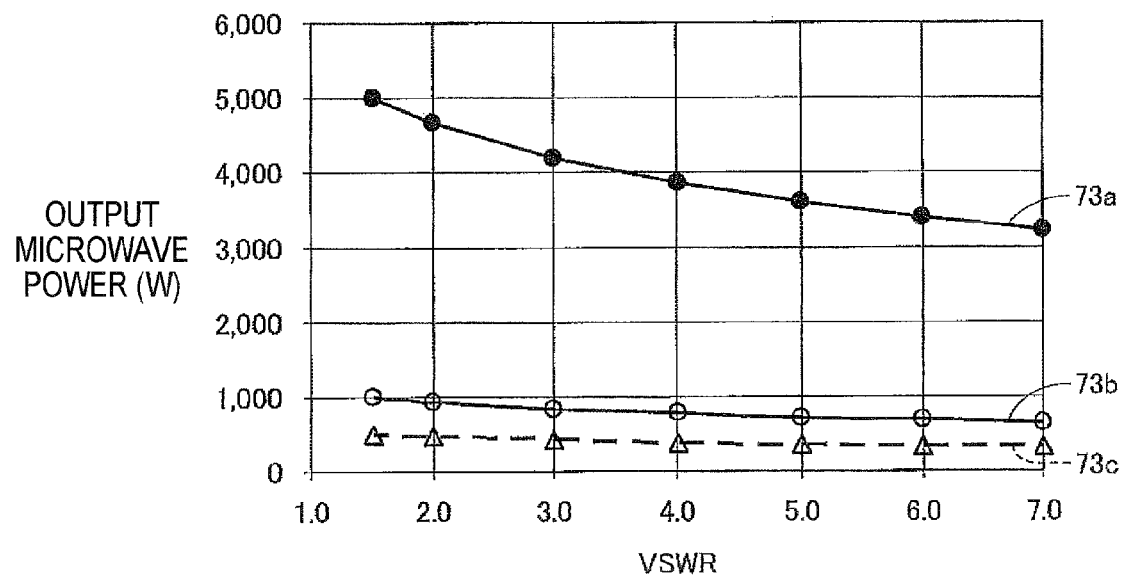
FIG. 14 is a graph representing a relationship between a VSWR and a range of stable output microwave power and a possible low power output.

Next, descriptions will be made on a relationship between a VSWR and an output microwave power based on a difference in anode value. FIG. 14 is a graph representing a relationship between a VSWR and a range of stable output microwave power and a possible low power output. The horizontal axis represents a VSWR and the vertical axis represents an output microwave power (W). The anode current shows each of values 1.01 A, 0.23 A, and 0.12 A which are indicated by a solid line 73a, a solid line 73b, and a dotted line 73c, respectively. Referring to FIG. 14, the maximum stable power output is obtained when the anode current is 1.01 A, and the minimum stable power output is obtained when the anode current is 0.23 A. The region between the solid line 73a and the solid line 73b is a range where an output microwave power is stably obtained. In addition, moding does not occur with the minimum possible power output when the anode current is 0.12 A. In the maximum stable power output, the output power tends to decrease as the VSWR value increases. However, the tendency is reduced in the minimum stable power output and minimum possible power output.

Figure 15:
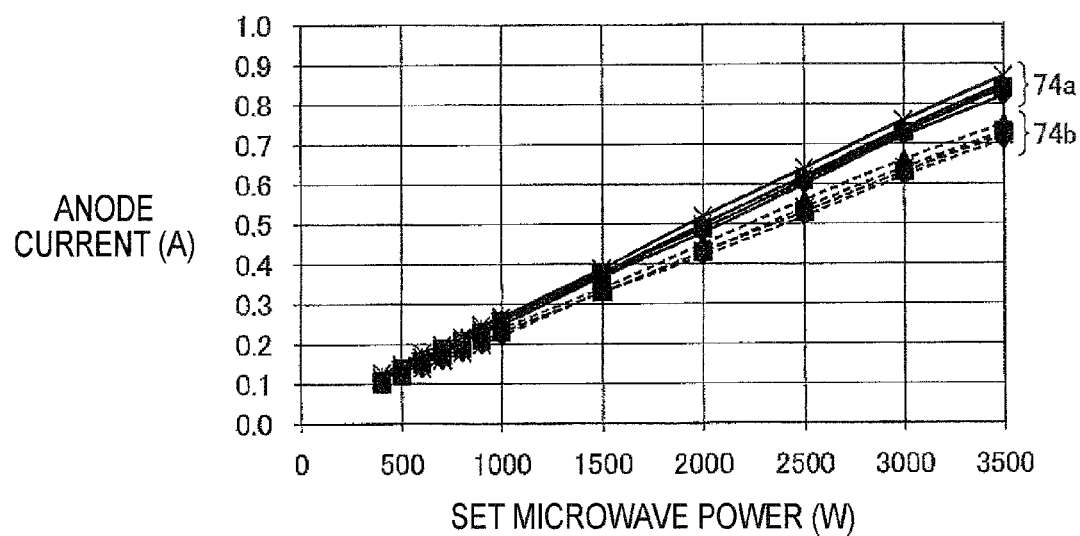
FIG. 15 is a graph illustrating a relationship between a set microwave power and an anode current based on a difference among a plurality of magnetrons in which the range of the set microwave power (W) from 0 W to 3500 W is illustrated.
Figure 16:
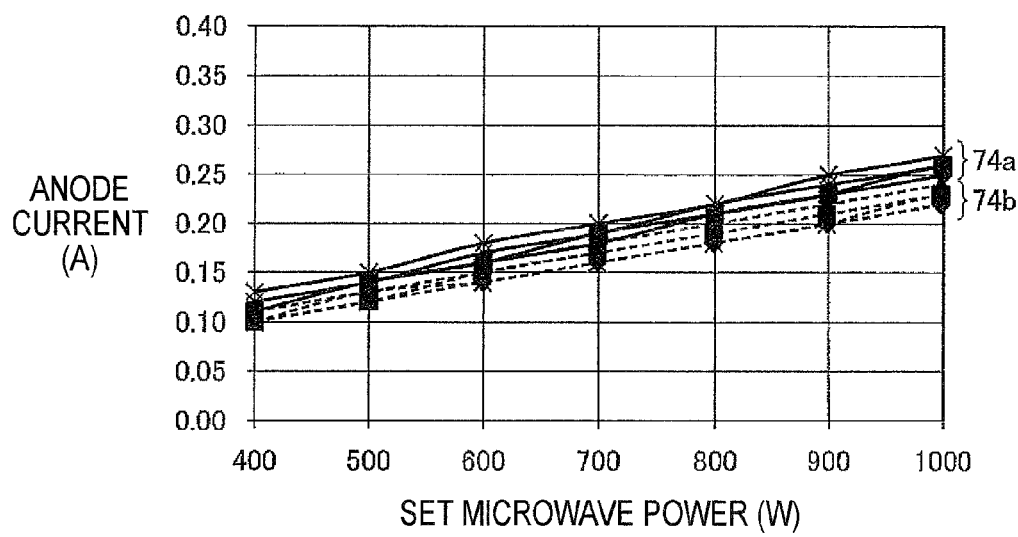
FIG. 16 is a graph illustrating a relationship between a set microwave power and an anode current based on a difference among a plurality of magnetrons in which the range of the set microwave power (W) from 400 W to 1000 W is illustrated in an enlarged scale with respect to the graph of FIG. 15.

Next, descriptions will be made on a relationship between a set microwave power and an anode current among a plurality of magnetrons. FIGS. 15 and 16 are graphs representing a relationship between a set microwave power and an anode current based on a difference among a plurality of magnetrons. The horizontal axis represents a set microwave power (W), and the vertical axis represents an anode current (A). FIG. 15 represents a range of set microwave power (W) from 0 W to 3500 W, and FIG. 16 represents a range of set microwave power (W) from 400 W to 1000 W in an enlarged scale. Five grapes indicated by lines 74a in FIGS. 15 and 16 represent five different magnetrons when the VSWR is 2.0, and five grapes indicated by lines 74b in FIGS. 15 and 16 represent the five different magnetrons when the VSWR is 1.5. That is, the five different magnetrons were measured when the VSWR was 2.0 and when the VSWR was 1.5. Referring to FIGS. 15 and 16, when the VSWR is varied from 1.5 to 2.0, the anode current may be increased. The five different magnetrons also show the same tendency as this.

Next, descriptions will be made on different frequency components deviated from a fundamental frequency. As another frequency characteristic of oscillated microwaves of a magnetron, there are different frequency components so-called spurious which is not intended in design. The different frequency components are included in high frequency waves. The different frequency components tend to increase when a magnetron is used. The increase of the different frequency components generates reflected waves in a waveguide path and a matcher where the high frequency waves oscillated by the magnetron are propagated. When the reflected waves are generated, the effective power of the magnetron or the impedance of load is varied when microwaves are generated. Thus, it is not desirable that the reflected waves are generated. Accordingly, it is desirable that the influence of the different frequency components is suppressed as much as possible.

Figure 17:
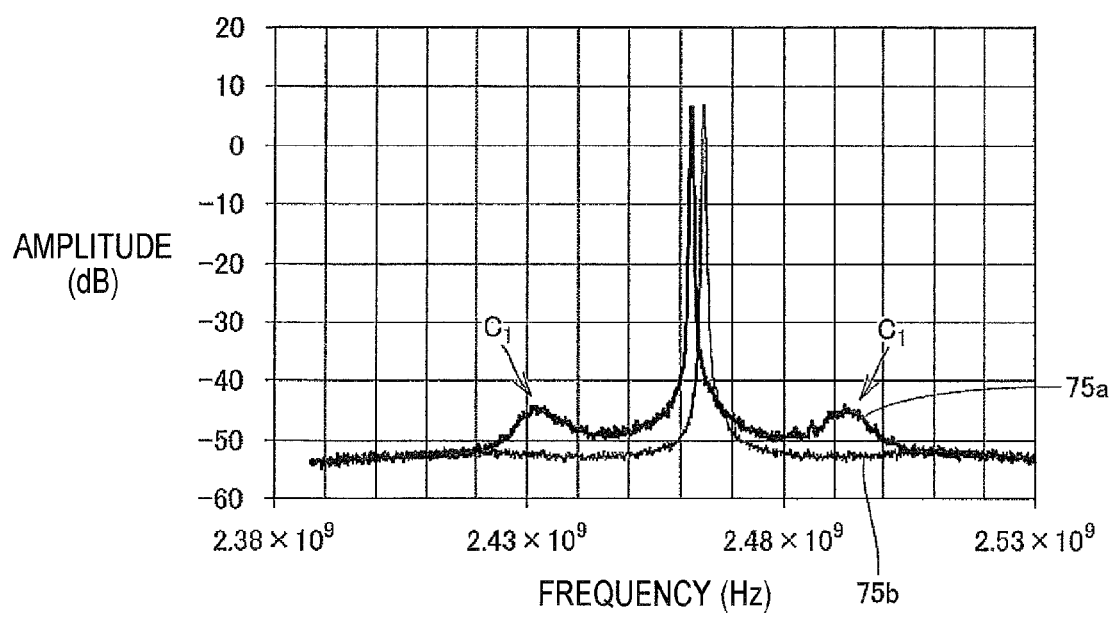
FIG. 17 is a graph illustrating a spectrum shape when the VSWR was set to 1.5 and a spectrum shape when the VSWR was set to 2.0, in which the set microwave power was 700 W.
Figure 18:
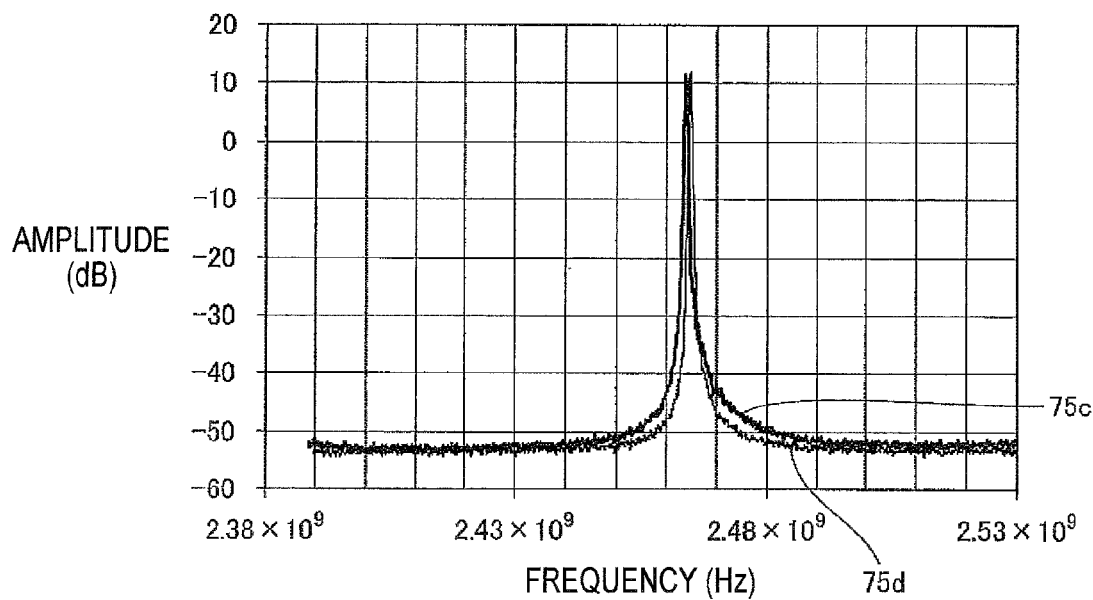
FIG. 18 is a graph illustrating a spectrum shape when the VSWR was set to 1.5 and a spectrum shape when the VSWR was set to 2.0, in which the set microwave power was 2500 W.

FIGS. 17 and 18 illustrate a spectrum shape when the VSWR was set to 1.5 and a spectrum shape when the VSWR was set to 2.0, respectively. FIG. 17 corresponds to a case where the set microwave power was 700 W, and FIG. 18 corresponds to a case where the set microwave power was 2500 W. In FIGS. 17 and 18, ach horizontal axis represents a frequency (Hz), and each vertical axis represents a spectrum intensity (dB). Lines 75a, 75c correspond to a case where the VSWR was set to 1.5, and lines 75b, 75d correspond to a case where the VSWR was set to 2.0. Referring to FIG. 15, when the VSWR was set to 1.5 in the case where the set microwave power was 700 W, side band peaks indicated by arrow $C_1$ in FIG. 17 appeared. The side band peak peaks are a kind of different frequency components so-called spurious. Whereas, when the VSWR was set to 2.0, the spurious such as the side band peaks hardly appeared. That is, in the magnetron, when the VSWR is varied from 1.5 to 2.0, the influence of different frequency components may be reduced. Meanwhile, referring to FIG. 18, in the case where the set microwave power is 2500 W, when the VSWR is set to 1.5, the skirt region of the peak is slightly broad but when the VSWR is set to 2.0, the skirt region of the peak tends to be narrowed.

Figure 19:
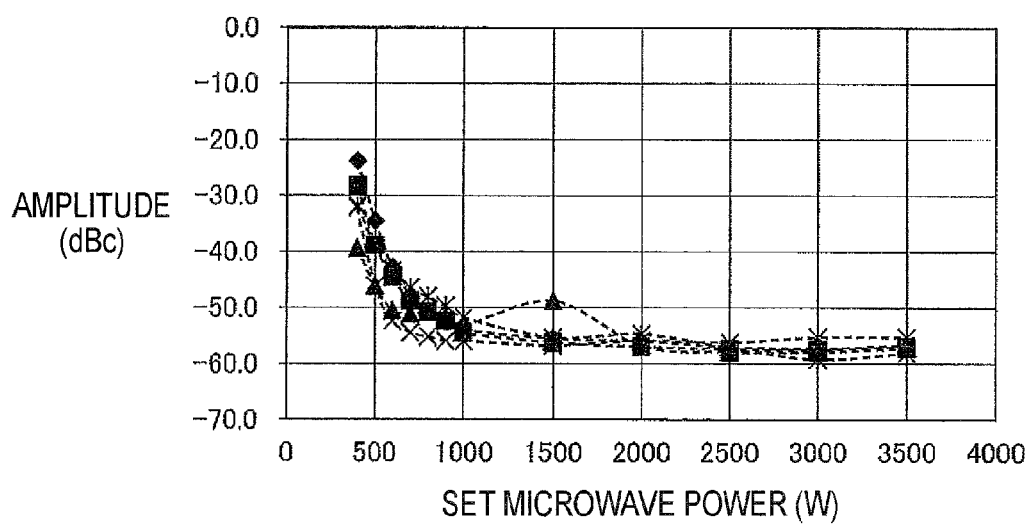
FIG. 19 is a graph representing a relationship between a set microwave power and a spurious intensity when the VSWR was set to 1.5.
Figure 20:
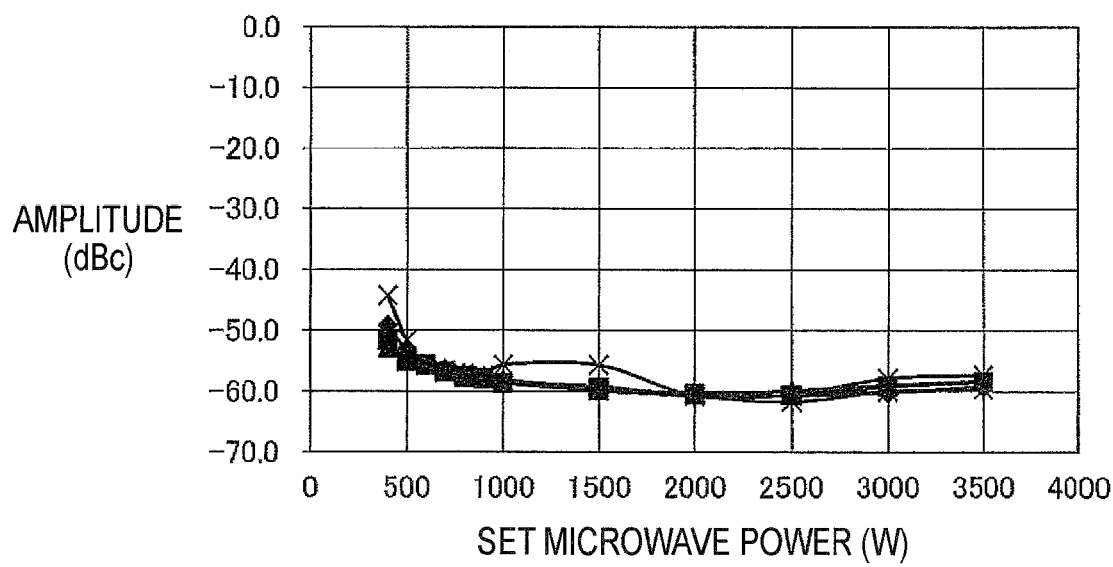
FIG. 20 is a graph representing a relationship between a set microwave power and a spurious intensity when the VSWR was set to 2.0.
Figure 21:
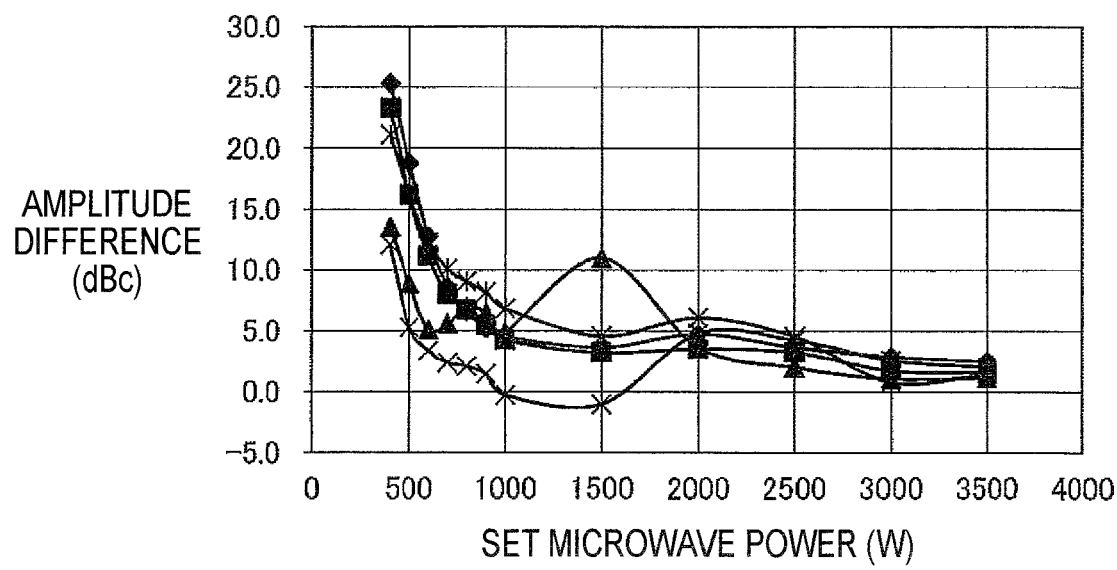
FIG. 21 is a graph illustrating a set microwave power and a difference of spurious intensity obtained by subtracting the spurious intensity when the VSWR was set to 2.0 from the spurious intensity when the VSWR was set to 1.5.

FIG. 19 is a graph representing a relationship between a set microwave power and a spurious intensity when the VSWR was set to 1.5. FIG. 20 is a graph illustrating a relationship between a set microwave power and a spurious intensity when the VSWR was set to 2.0. FIG. 21 is a graph illustrating a set microwave power and a difference of spurious intensity obtained by subtracting the spurious intensity when the VSWR was set to 2.0 from the spurious intensity when the VSWR was set to 1.5. Each horizontal axis in FIGS. 19 to 21 represents a set microwave power (W), each vertical axis in FIGS. 19 and 20 represents a spurious intensity (dB), and the vertical axis in FIG. 21 represents a difference of spurious intensity (dB). Meanwhile, in FIGS. 19 to 21, five data indicated by black diamond-shaped marks, black square marks, black triangle marks, and cross marks, and ※ marks represent results obtained by measuring different devices, i.e. five different magnetrons, respectively. Referring to FIGS. 19 to 21, it may be understood that when the VSWR was set to 2.0, side band peaks are reduced, especially, at low power sides as compared the case where the VSWR was set to 1.5.

Figure 22:
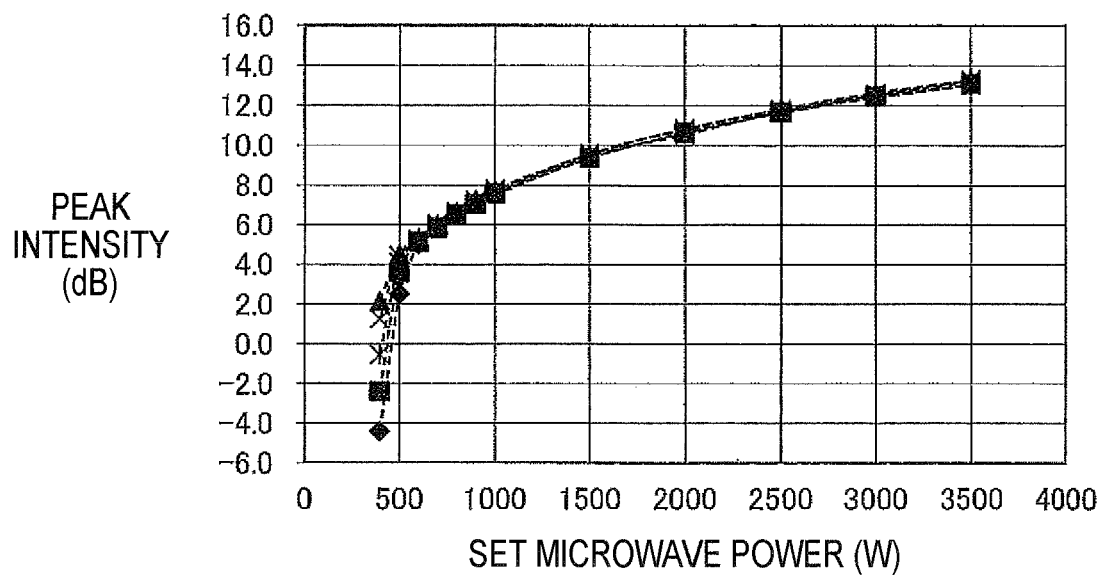
FIG. 22 is a graph illustrating a relationship between a set microwave power and a peak intensity when the VSWR was set to 1.5.
Figure 23:
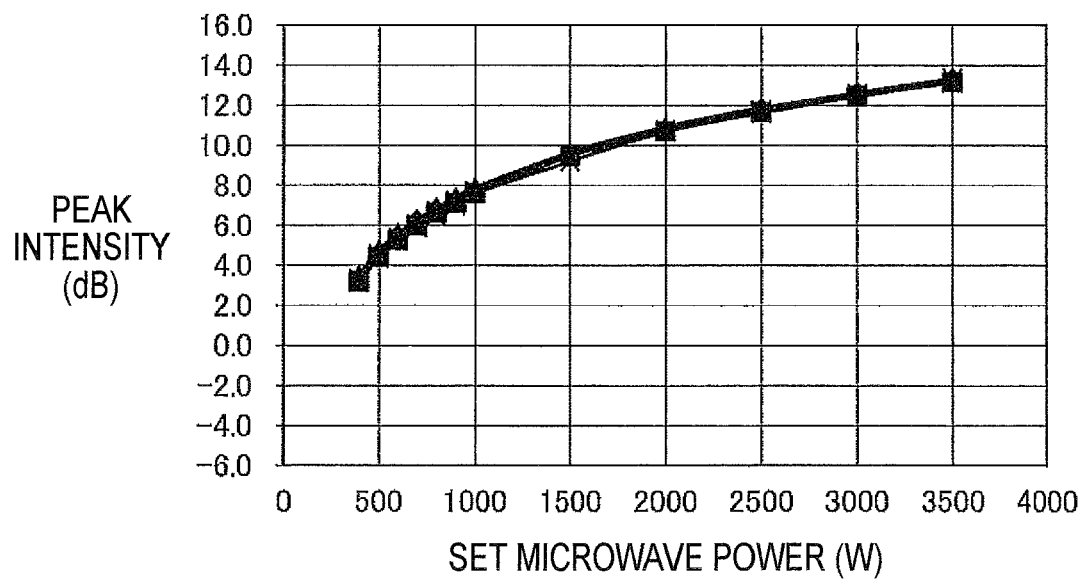
FIG. 23 is a graph illustrating a relationship between a set microwave power and a peak intensity when the VSWR was set to 2.0.
Figure 24:
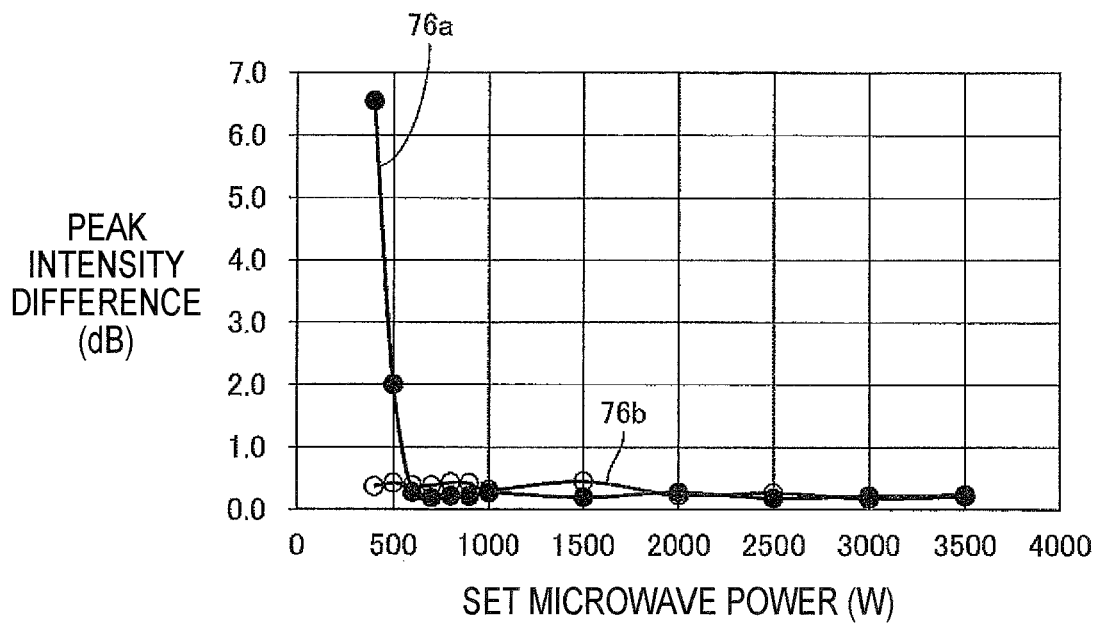
FIG. 24 is a graph illustrating a relationship between a set microwave power and a difference of peak intensity obtained by subtracting the peak intensity when the VSWR was set to 2.0 from the peak intensity when the VSWR was set to 1.5.

FIG. 22 is a graph illustrating a relationship between a set microwave power and a peak intensity when the VSWR was set to 1.5. FIG. 23 is a graph illustrating a relationship between a set microwave power and a peak intensity when the VSWR was set to 2.0. FIG. 24 is a graph illustrating a relationship between a set microwave power and a difference of peak intensity obtained by subtracting the peak intensity when the VSWR was set to 2.0 from the peak intensity when the VSWR was set to 1.5. Each horizontal axis in FIGS. 22 to 24 represents a set microwave power (W), each vertical axis in FIGS. 22 and 23 represents a peak intensity (dB), and the vertical axis in FIG. 24 represents a difference of peak intensity (dB). Meanwhile, in FIGS. 22 and 23, five data indicated by black diamond-shaped marks, black square marks, black triangle marks, and cross marks, and ※ marks represent results obtained by measuring different devices, i.e. five different magnetrons, respectively. In FIG. 24, a line 76a represents values obtained by subtracting the minimum values of five magnetrons from the maximum values of five magnetrons when the VSWR was set to 1.5, and a line 76b represents values obtained by subtracting the minimum values of five magnetrons from the maximum values of the five magnetrons when the VSWR was set to 2.0. Referring to FIGS. 22 to 24, when the VSWR is set to 1.5, the variation of the values is large at the low power side. Whereas, when the VSWR is set to 2.0, the variation of the values is also small at the low power side.

Figure 25:
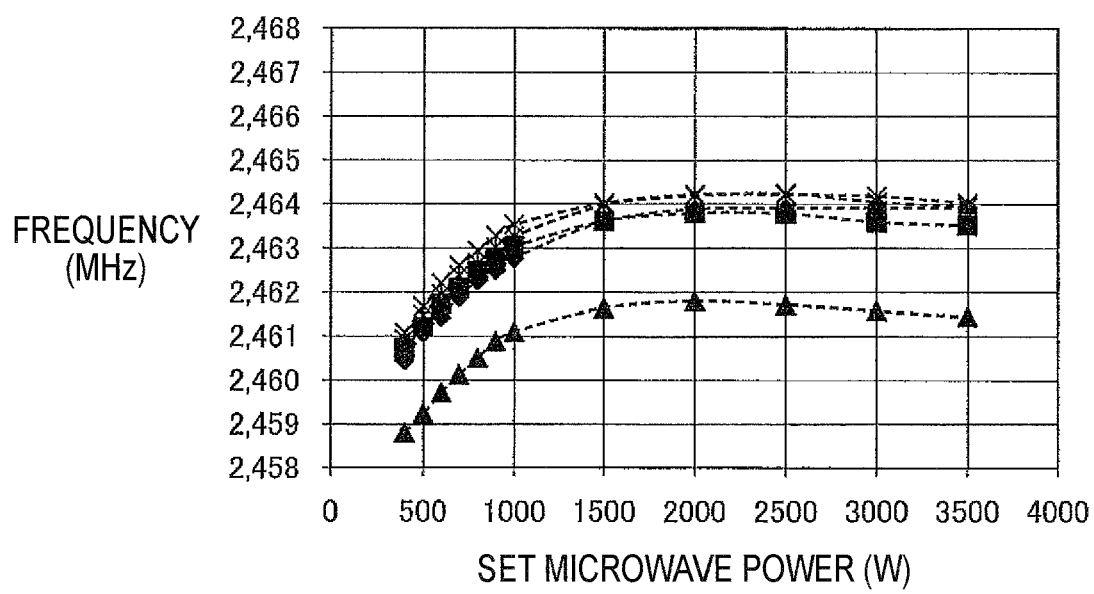
FIG. 25 is a graph representing a relationship between a set microwave power and a frequency when the VSWR was set to 1.5.
Figure 26:
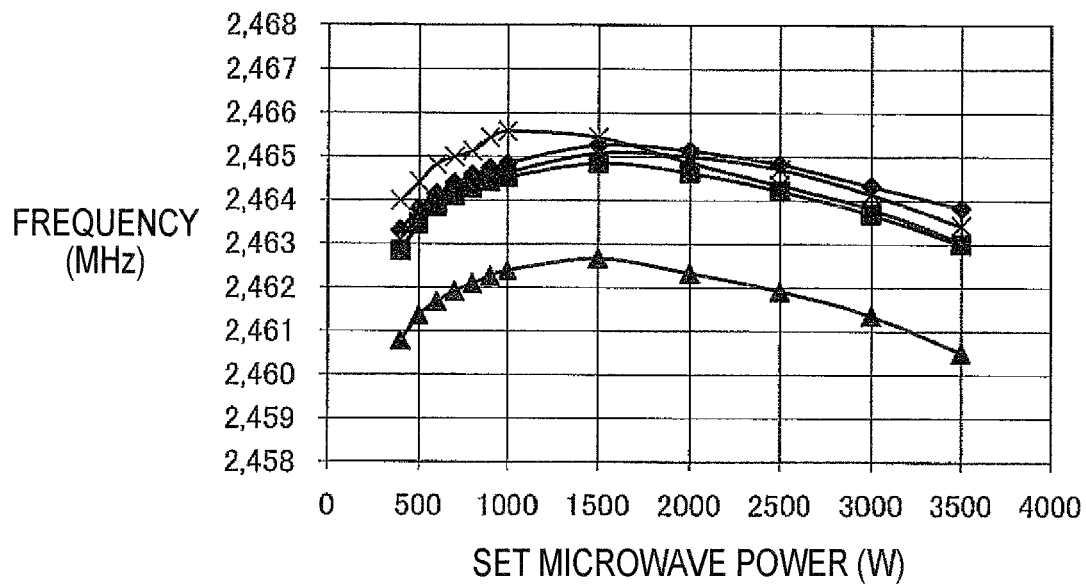
FIG. 26 is a graph representing a relationship between a set microwave power and a frequency when the VSWR was set to 2.0.
Figure 27:
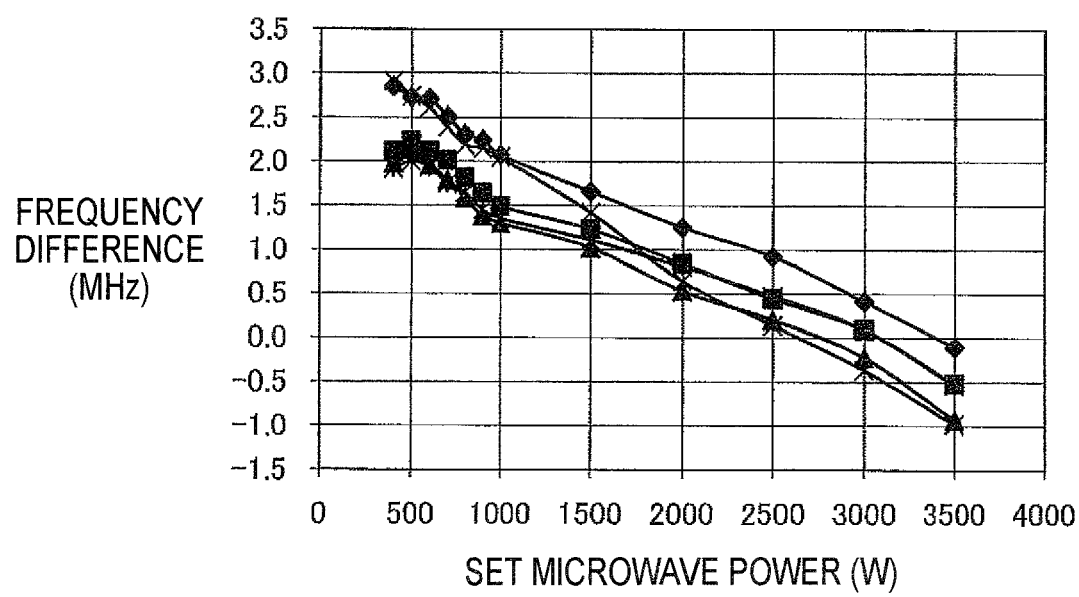
FIG. 27 is a graph illustrating a relationship between a set microwave power and a difference between a frequency when the VSWR was set to 1.5 and a frequency when the VSWR was set to 2.0.

Next, descriptions will be made on an oscillated fundamental frequency. FIG. 25 is a graph representing a relationship between a set microwave power and a frequency when the VSWR was set to 1.5. FIG. 26 is a graph representing a relationship between a set microwave power and a frequency when the VSWR was set to 2.0. FIG. 27 is a graph illustrating a relationship between a set microwave power and a difference between a frequency when the VSWR was set to 1.5 and a frequency when the VSWR was set to 2.0. Each horizontal axis in FIGS. 25 to 27 represents a set microwave power (W), each vertical axis in FIGS. 25 and 26 represents frequency (MHz), and the vertical axis in FIG. 27 represents a difference of frequency (MHz). Meanwhile, in FIGS. 22 to 27, five data indicated by black diamond-shaped marks, black square marks, black triangle marks, and cross marks, and ※ marks represent results obtained by measuring different devices, i.e. five different magnetrons, respectively. That is, in a case where a standard was established as 2463±5 (MHz), the standard was satisfied either when the VSWR was set to 1.5 or when the VSWR was set to 2.0, when the number of evaluations n is 5 (n=5). In addition, in a case where the set microwave power is low, the frequency becomes larger when the VSWR is set to 2.0. However, when the set microwave power increases, the frequency became larger when the VSWR is set to 1.5.

Figure 28:
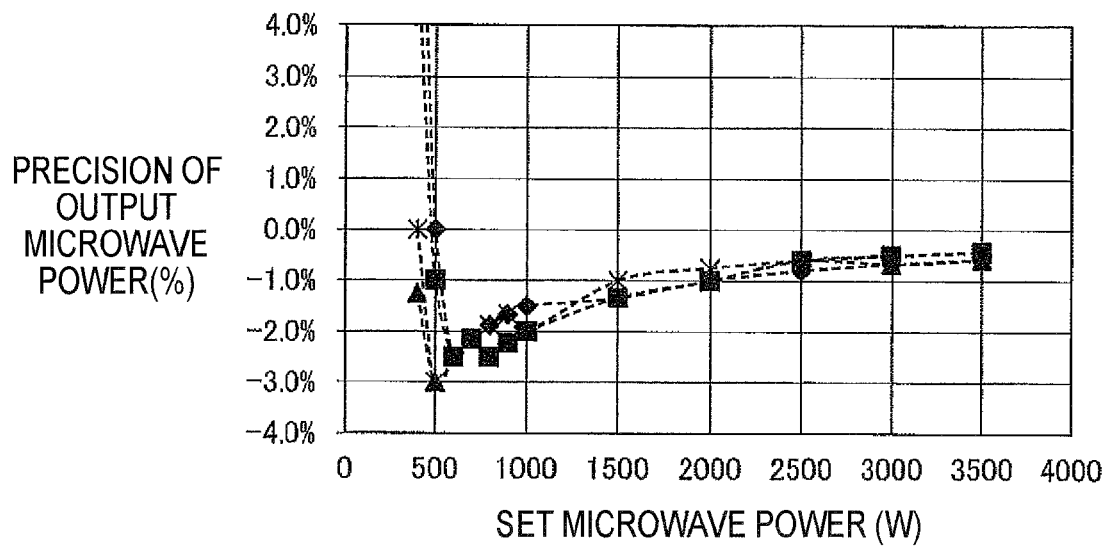
FIG. 28 is a graph illustrating a relationship between a set microwave power and precision of an output microwave power when the VSWR was set to 1.5.
Figure 29:
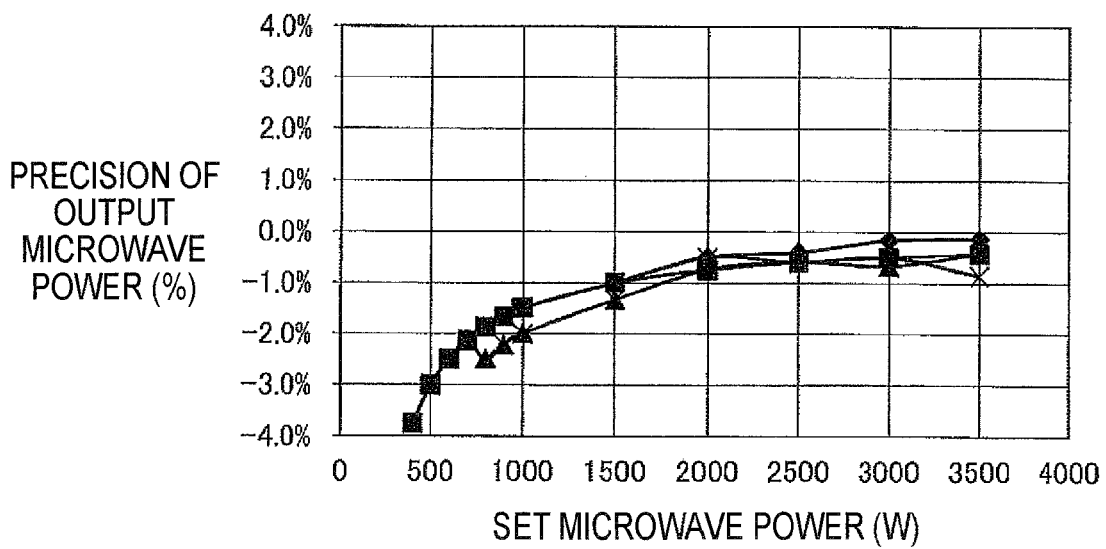
FIG. 29 is a graph illustrating a relationship between a set microwave power and precision of an output microwave power when the VSWR was set to 2.0.
Figure 30:
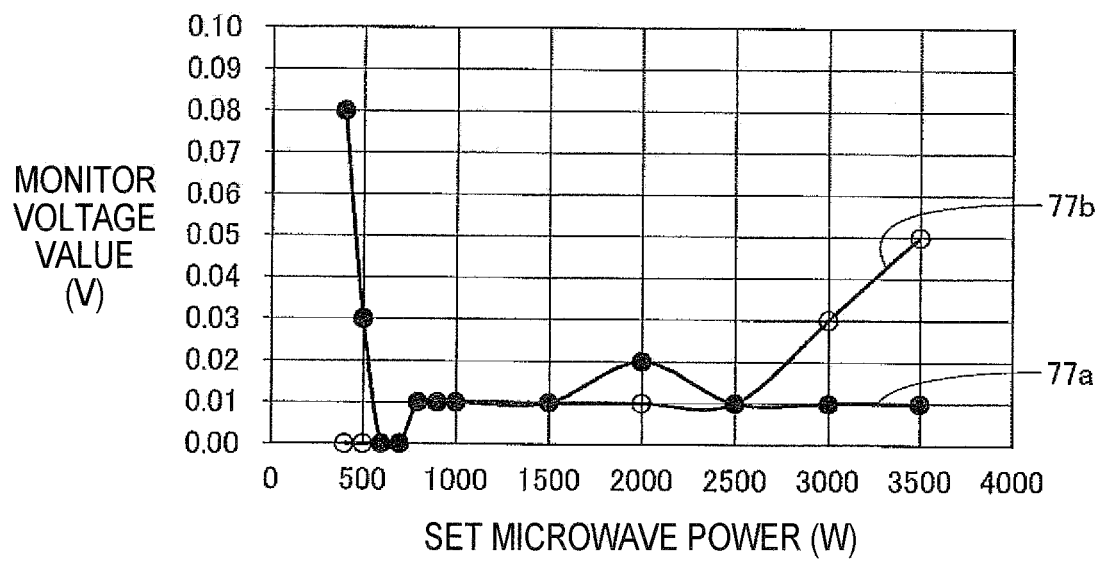
FIG. 30 is a graph representing a relationship between a set microwave power and a monitor voltage value when the VSWR was set to 1.5 and a relationship between a set microwave power and a monitor voltage when the VSWR was set to 2.0.

Next, descriptions will be made on a precision of an output microwave power. FIG. 28 is a graph illustrating a relationship between a set microwave power and a precision of an output microwave power when the VSWR was set to 1.5. FIG. 29 is a graph illustrating a relationship between a set microwave power and a precision of an output microwave power when the VSWR was set to 2.0. FIG. 30 is a graph representing a relationship between a set microwave power and a monitor voltage value when the VSWR was set to 1.5 and a relationship between a set microwave power and a monitor voltage when the VSWR was set to 2.0. Each horizontal axis in FIGS. 28 to 30 represents a set microwave power W, each vertical axis in FIGS. 28 and 29 represents a precision (%) of output microwave power, and the vertical axis in FIG. 30 represents a monitor voltage value. Meanwhile, in FIGS. 28 and 29, five data indicated by black diamond-shaped marks, black square marks, black triangle marks, and cross marks, and ※ marks represent results obtained by measuring different devices, i.e. five different magnetrons, respectively. In FIG. 30, a line 77a represents the measured results when the VSWR was set to 1.5, and a line 77b represents the measured results when the VSWR was set to 2.0. Referring to FIGS. 28 to 30, when the VSWR was set to 1.5, variation is large at the low power side, but when the VSWR was set to 2.0, variation is also small at the low power side. Further, it may be understood that, when the VSWR is set to 2.0, the variation of monitor voltage values is small at the low power side.

Next, descriptions will be made on a relationship between a set microwave power and efficiency. FIG. 31 is a graph representing a relationship between a set microwave power and efficiency. The horizontal axis represents a set microwave power (W), and the vertical axis represents efficiency (%). A line 78a corresponds to a case when the VSWR is set to 1.5, and a line 78b corresponds to a case where the VSWR is set to 2.0. Referring to FIG. 31, it may be understood that the efficiency when the VSWR is set to 1.5 tends to be better than the efficiency when the VSWR is set to 2.0.

As described above, a condition for varying the VSWR is reviewed and set for each magnetron in consideration of relationships among, for example, an anode current, an output microwave power, a VSWR, and efficiency, and a magnitude of voltage standing waves formed in a waveguide path is varied, that is, the VSWR is varied so that the condition for varying the VSWR is varied depending on the power supplied from the power supply unit.

From the foregoing, according to the configuration described above, more stable plasma may be generated over a wide region from a low power to a high power, and a broad process condition may be constructed.

Meanwhile, in the exemplary embodiments described above, it has been described that a magnetron is used as a high frequency oscillator. Without being limited thereto, however, the present disclosure may also be applied to a case where another high frequency oscillator is used.

In addition, in the exemplary embodiments described above, it has been described that a stub mechanism is used as a voltage standing wave ratio variable mechanism. Without being limited thereto, however, another mechanism may be used so as to make a standing wave ratio variable.

Meanwhile, in the exemplary embodiments described above, it has been described that VSWR is changed using a predetermined value as a threshold. Without being limited, thereto, VSWR may be changed in multiple stages, and VSWR may be changed linearly so that VSWR and anode current have a proportional relationship, for example.

In addition, it has been described that a plasma processing is performed by microwaves using a radial line slot antenna. Without being limited thereto, however, a plasma processing apparatus that is provided with a comb type antenna and generates plasma by microwaves, or a plasma processing apparatus that generates microwaves from slots to generate plasma may also be used.

Although exemplary embodiments of the present invention have been described above with reference to the accompanying drawings, the present invention is not limited to the illustrated exemplary embodiments. Various modifications and changes may be applied to the illustrated exemplary embodiments within the scope of the present invention or within a scope equivalent thereto.

[Descriptions of Symbols]

| | |
|---|---|
| 11: plasma processing apparatus | 12: processing container |
| 13, 26, 27: gas supply section | 14: holding stage |
| 15: control unit | 16: dielectric window |
| 17: slot antenna plate | 18: dielectric member |
| 19: plasma generating mechanism | 20: slot hole |
| 21: bottom portion | 22: side wall |
| 23: exhaust port | 24: cover portion |
| 25: O-ring | 28: bottom surface |
| 29: gas supply system | 30a, 30b: gas supply hole |
| 31: cylindrical support | 32: cooling jacket |
| 33: temperature adjustment mechanism | 34: mode converter |
| 35a, 35b, 35c: waveguide | 36: coaxial waveguide |
| 37: recess | |
| 38: high frequency power supply | 39: matching unit |
| 40: circulation path | 41: microwave generator |
| 42: magnetron | |

-continued

[Descriptions of Symbols]

| | |
|---|---|
| 43: high voltage power supply | 44a: cathode electrode |
| 44b: anode electrode | |
| 45, 55a, 55b, 57a, 57b: circulator | |
| 46: filament power supply | 47: oscillation unit |
| 48: launcher | 49: isolator |
| 50: load | 51: 4E tuner |
| 52a, 52b, 52c, 52d: movable short-circuit unit | |
| 53a, 53b, 53c: probe | |
| 53d: arithmetic operation circuit | |
| 54: directional coupler | 60, 65: waveguide path |
| 55c, 55d: detector | 56: voltage control circuit |
| 58a, 58b, 58c: terminal | 59: dummy load |
| 61: voltage standing wave ratio variable mechanism | |
| 62: stub mechanism | 63: driver |
| 64a, 64b, 64c: rod-shaped member | |
| 66a, 66b, 66c, 67a, 67b, 68a, 68b, 68c, 68d, 70a, 70b, 70c, 70d, 70e, 70f, 70g, 71a, 71b, 71c, 71d, 71e, 73a, 73b, 73c, 74a, 74b, 75a, 75b, 75c, 75d, 76a, 76b, 77a, 77b, 78a, 78b: line | |
| 69a, 69b: point | 72: region |

What is claimed is:

1. A plasma processing apparatus that performs a processing on a processing target object using plasma, the plasma processing apparatus comprising:
    a processing container configured to perform a processing by plasma therein; and
    a plasma generating mechanism including a high frequency generator disposed outside of the processing container to generate high frequency waves, the plasma generating mechanism being configured to generate plasma in the processing container using the high frequency waves generated by the high frequency generator,
    wherein the high frequency generator includes:
    a high frequency oscillator configured to oscillate the high frequency waves;
    a power supply unit configured to supply a power to the high frequency oscillator;
    a waveguide path configured to propagate the high frequency waves oscillated by the high frequency oscillator to the processing container side which becomes a load side; and
    a voltage standing wave ratio variable mechanism configured to vary a voltage standing wave ratio of voltage standing waves formed in the waveguide path by the high frequency waves, according to the power supplied from the power supply unit, and
    wherein the voltage standing wave ratio variable mechanism is further configured to perform a control to increase the voltage standing wave ratio when the power supplied from the power supply unit to the high frequency oscillator is lower than a predetermined value such that in a fundamental frequency waveform of the high frequency oscillator, a slope of a peak of the fundamental frequency waveform is increased and a skirt region of the peak of the fundamental frequency waveform is decreased.

2. The plasma generating apparatus of claim 1, wherein the voltage standing wave ratio variable mechanism includes a stub mechanism provided in the waveguide path and including a rod-shaped member movable in a radial direction, a driver configured to move the rod-shaped member, and a control mechanism configured to control the movement of the rod-shaped member.

3. The plasma processing apparatus of claim 2, wherein a plurality of rod-shaped members are provided to be spaced apart from each other in a direction where the high frequency waves travel.

4. The plasma processing apparatus of claim 2, wherein the high frequency generator includes a directional coupler installed in the waveguide path, the directional coupler being configured to branch some of travelling waves that travel in the waveguide path and reflected waves from the load side, and
    the control mechanism controls the movement of the stub member based on a travelling wave power signal and a reflected wave power signal which are obtained from the directional coupler.

5. The plasma processing apparatus of claim 1, wherein the plasma generating mechanism includes a 4E tuner provided with four movable short-circuit plates, the four movable short-circuit plates being provided to be spaced apart from each other in the travelling direction of the high frequency waves.

6. The plasma processing apparatus of claim 2, wherein the waveguide path includes a launcher from which the high frequency waves oscillated by the high frequency oscillator are taken out, and an isolator provided at a downstream side of the launcher, the isolator being configured to transmit a frequency signal in one direction from the high frequency oscillator to the load side, and
    the stub mechanism is provided on the launcher or at the downstream side of the launcher and at an upstream side of the isolator.

7. The plasma processing apparatus of claim 1, wherein the plasma generating mechanism includes a dielectric window configured to transmit the high frequency waves generated by the high frequency oscillator into the processing container, and a slot antenna plate having a plurality of slot holes formed therein to radiate the high frequency waves to the dielectric window.

8. The plasma processing apparatus of claim 7, wherein the plasma generated by the plasma generating mechanism is produced by the radial line slot antenna.

9. A high frequency generator comprising:
    a high frequency oscillator configured to oscillate high frequency waves;
    a power supply unit configured to supply a power to the high frequency oscillator;
    a waveguide path configured to propagate the high frequency waves oscillated by the high frequency oscillator to the processing container which becomes a load side; and
    a voltage standing wave ratio variable mechanism configured to vary a voltage standing wave ratio of voltage standing waves formed in the waveguide path by the high frequency waves, according to the power supplied from the power supply unit,
    wherein the voltage standing wave ratio variable mechanism is configured to perform a control to increase the voltage standing wave ratio when the power supplied from the power supply unit to the high frequency oscillator is lower than a predetermined value such that in a fundamental frequency waveform of the high frequency oscillator, a slope of a peak of the fundamental frequency waveform is increased and a skirt region of the peak of the fundamental frequency waveform is decreased.

* * * * *